United States Patent
Hiraoka et al.

(10) Patent No.: US 7,979,942 B2
(45) Date of Patent: Jul. 19, 2011

(54) SUBSTRATE TREATMENT APPARATUS AND SUBSTRATE TREATMENT METHOD

(75) Inventors: Nobuyasu Hiraoka, Kyoto (JP); Tsuyoshi Okumura, Kyoto (JP); Akiyoshi Nakano, Kyoto (JP); Hajime Ugajin, Kanagawa (JP)

(73) Assignees: Dainippon Screen Mfg. Co., Ltd. (JP); Sony Corporation (JP)

( * ) Notice: Subject to any disclaimer, the term of this patent is extended or adjusted under 35 U.S.C. 154(b) by 1030 days.

(21) Appl. No.: 11/694,333

(22) Filed: Mar. 30, 2007

(65) Prior Publication Data
US 2007/0226926 A1 Oct. 4, 2007

(30) Foreign Application Priority Data

Mar. 30, 2006 (JP) .................... 2006-095552
Mar. 30, 2006 (JP) .................... 2006-095553
Mar. 30, 2006 (JP) .................... 2006-095554

(51) Int. Cl.
*B08B 1/04* (2006.01)

(52) U.S. Cl. ................ 15/77; 15/102; 15/88.2

(58) Field of Classification Search ............. 15/77, 88.2, 15/88.3, 102; 134/6; B08B 1/04; A46B 11/06
See application file for complete search history.

(56) References Cited

U.S. PATENT DOCUMENTS

| | | | |
|---|---|---|---|
| 5,351,360 A * | 10/1994 | Suzuki et al. ................ | 15/302 |
| 5,624,501 A | 4/1997 | Gill, Jr. | |
| 5,725,414 A * | 3/1998 | Moinpour et al. ........... | 451/41 |
| 5,829,087 A | 11/1998 | Nishimura et al. | |
| 5,861,066 A | 1/1999 | Moinpour et al. | |
| 5,868,866 A | 2/1999 | Maekawa et al. | |
| 6,059,891 A | 5/2000 | Kubota et al. | |
| 6,178,580 B1 | 1/2001 | Ishihara et al. | |
| 6,248,009 B1 | 6/2001 | Ito et al. | |
| 6,550,091 B1 * | 4/2003 | Radman et al. ................ | 15/77 |

(Continued)

FOREIGN PATENT DOCUMENTS

| | | |
|---|---|---|
| CN | 2374139 Y | 4/2000 |
| CN | 1706564 | 12/2005 |
| JP | 4-364730 | 12/1992 |

(Continued)

OTHER PUBLICATIONS

Official Action (Notice of Allowance) issued on Jan. 30, 2009 in connection with corresponding Korean Patent Application No. 10-2007-0030358 (JP2001-9386 was previously filed in an IDS dated Sep. 3, 2008 and is therefore not submitted.).

(Continued)

*Primary Examiner* — Monica S Carter
*Assistant Examiner* — Stephanie Newton
(74) *Attorney, Agent, or Firm* — Ostrolenk Faber LLP

(57) ABSTRACT

A substrate treatment apparatus including a substrate holding mechanism for holding a substrate; a first brush made of an elastically deformable material and having a cleaning surface inclined with respect to a perpendicular direction perpendicular to one surface of the substrate held by the substrate holding mechanism; a first brush moving mechanism for moving the first brush with respect to the substrate held by the substrate holding mechanism; a controller for controlling the first brush moving mechanism so that the cleaning surface is made to contact with a peripheral area on the one surface and a peripheral end face of the substrate held by the substrate holding mechanism; and a first pushing pressure holding mechanism for holding a pushing pressure of the first brush in the perpendicular direction to the peripheral area on the one surface of the substrate at a preset pushing pressure.

21 Claims, 13 Drawing Sheets

U.S. PATENT DOCUMENTS

| | | | |
|---|---|---|---|
| 6,560,809 | B1 | 5/2003 | Atoh |
| 6,622,334 | B1 | 9/2003 | Ziemins et al. |
| 6,647,579 | B2 * | 11/2003 | Manfredi et al. .................. 15/77 |
| 6,910,240 | B1 | 6/2005 | Boyd et al. |
| 2002/0092544 | A1 | 7/2002 | Namba |

FOREIGN PATENT DOCUMENTS

| | | |
|---|---|---|
| JP | 10-229063 | 8/1998 |
| JP | 10-261605 | 9/1998 |
| JP | 11-625 | 1/1999 |
| JP | 11-040530 | 2/1999 |
| JP | 2000-49131 | 2/2000 |
| JP | 2001-9386 | 1/2001 |
| JP | 2001-70896 | 3/2001 |
| JP | 2001-212531 | 8/2001 |
| JP | 2002-18368 | 1/2002 |
| JP | 2003-151943 | 5/2003 |
| JP | 2003-197592 | 7/2003 |
| KR | 96-15790 | 10/1994 |
| KR | 2003-0003513 | 1/2003 |

OTHER PUBLICATIONS

Office Action issued Jul. 24, 2008 in connection with the Korean Patent Application No. 10-2007-0030358 which corresponds to this case.

Office Action issued Jun. 5, 2009 in Chinese Patent Application No. 2007100919302, which corresponds to related U.S. Appl. No. 11/694,078 of Nobuyasu Hiraoka. filed Mar. 30, 2007.

Office Action issued Mar. 27, 2008 in Korean Patent Application No. 10-20007-0030356, which corresponds to related U.S. Appl. No. 11/694,078 of Nobuyasu Hiraoka. filed Mar. 30, 2007.

Office Action issued Sep. 22, 2008 in Korean Application No. 10-2007-0030356, which corresponds to related U.S. Appl. No. 11/694,078 of Nobuyasu Hiraoka. filed Mar. 30, 2007.

Official Action issued Jan. 6, 2011 in connection with corresponding Japanese Patent Application No. 2006-095553 (JP2003-151943 was previously submitted in an IDS filed on Mar. 30, 2007 and is therefore not enclosed.).

Official Action issued Jan. 6, 2011 in connection with corresponding Japanese Patent Application No. 2006-095554 (JP2003-151943 was previously submitted in an IDS filed on Mar. 30, 2007 and is therefore not enclosed.).

Official Action issued Jan. 6, 2011 in connection with corresponding Japanese Patent Application No. 2006-095552 (JP2003-151943 was previously submitted in an IDS filed on Mar. 30, 2007 and is therefore not enclosed.).

* cited by examiner

SUBSTRATE TREATMENT APPARATUS AND SUBSTRATE TREATMENT METHOD

CROSS-REFERENCE TO RELATED APPLICATION

This application is related to U.S. Ser. No. 11/694,078 filed Mar. 30, 2007.

BACKGROUND OF THE INVENTION

1. Field of the Invention

The present invention relates to a substrate treatment apparatus and a substrate treatment method for cleaning substrates. Substrates to be treated include semiconductor wafers, substrates for liquid crystal displays, substrates for plasma displays, substrates for FEDs (Field Emission Displays), substrates for optical discs, substrates for magnetic discs, substrates for magneto-optical discs, substrates for photomasks, etc.

2. Description of Related Art

In semiconductor device manufacturing processes, contaminants attached to the peripheral portion of a semiconductor wafer may have nonnegligible influence on the quality of the treated semiconductor wafer.

In the so-called batch treatment process, multiple semiconductor wafers are held in a vertical posture and immersed in treatment liquid. Hence, if contaminants are attached to the peripheral portion of each semiconductor wafer, the contaminants are dispersed into the treatment liquid and attached again to the device forming area on the front surface of the semiconductor wafer.

Therefore, in recent years, the need for cleaning the peripheral portions of substrates, such as semiconductor wafers, has increased.

As prior art regarding the cleaning of the peripheral portions of substrates, the configurations proposed in Document 1 (Japanese Unexamined Patent Publication No. 2003-197592), Document 2 (Japanese Unexamined Patent Publication No. 2003-151943) and Document 3 (U.S. Pat. No. 6,550,091) can be taken as examples.

Document 1 proposes a configuration in which a cylindrical brush is provided, and the outer circumferential face of the brush is made to contact with the peripheral end face of a substrate while the substrate is rotated, thereby removing contaminants attached to the peripheral end face of the substrate.

Document 2 proposes a configuration similar to the configuration proposed in Document 1, in which a cylindrical brush is pushed to the peripheral end face of a substrate, and the peripheral end face of the substrate is allowed to bite into the outer circumferential face of the brush so that contaminants attached to the peripheral end face of the substrate can be removed more satisfactorily regardless of the shape of the peripheral end face of the substrate. Furthermore, another configuration has been proposed in which a groove corresponding to the shape of the peripheral end face of the substrate is formed in the outer circumferential face of a brush and the peripheral end face of the substrate is fitted in the groove.

Document 3 proposes a configuration in which a groove into which the peripheral portion of a substrate can be fitted is formed in the outer circumferential surface of a cylindrical brush, the substrate is rotated while the peripheral portion of the substrate is fitted in this groove, and the brush is rotated around its central axis, whereby the peripheral areas (the ring-shaped areas with a predetermined width from respective peripheral edges on the front surface and the back surface of the substrate) on the front surface and the back surface and the peripheral end face of the substrate are cleaned.

According to the configurations proposed in Documents 1 and 2, contaminants attached to the peripheral end face of a substrate can be removed. However, since the brush does not make contact with the peripheral areas on the front surface and the back surface of the substrate, contaminants attached to the peripheral areas cannot be removed.

On the other hand, according to the configuration proposed in Document 3, the peripheral areas on the front surface and the back surface of a substrate can be cleaned. However, the cleaning width (the contact width of the brush) in the peripheral areas on the front surface and the back surface of the substrate cannot be changed easily. For solving this problem, it is conceivable to change the cleaning width in the peripheral areas on the front surface and the back surface of the substrate by changing the amount of insertion of the peripheral portion of the substrate into the groove of the brush. However, if the amount of insertion of the peripheral portion of the substrate into the groove of the brush is small, the brush does not make contact with the peripheral end face of the substrate and cannot clean the peripheral end face of the substrate. Hence, it is impossible to use the method of changing the amount of insertion of the peripheral portion of the substrate into the groove of the brush. Therefore, when the cleaning width in the peripheral portion is changed, the brush must be replaced with a brush having a groove with a different depth. This method is very troublesome.

Furthermore, if a substrate is deformed by warping, the pushing pressure to the upwardly deformed portion of the substrate received from the brush becomes different from the pushing pressure to the downwardly deformed portion of the substrate received from the brush. It may lead to other problems of uneven cleaning and nonuniform cleaning width.

SUMMARY OF THE INVENTION

An object of the present invention is to provide a substrate treatment apparatus and a substrate treatment method capable of satisfactorily cleaning the peripheral area on at least one surface and the peripheral end face of a substrate and capable of easily changing the cleaning width in the peripheral area.

A first substrate treatment apparatus according to the present invention includes a substrate holding mechanism for holding a substrate, a first brush made of an elastically deformable material and having a cleaning surface inclined with respect to a perpendicular direction perpendicular to one surface of the substrate held by the substrate holding mechanism; a first brush moving mechanism for moving the first brush with respect to the substrate held by the substrate holding mechanism; a controller for controlling the first brush moving mechanism so that the cleaning surface is made to contact with a peripheral area on the one surface and a peripheral end face of the substrate held by the substrate holding mechanism; and a first pushing pressure holding mechanism for holding a pushing pressure of the first brush in the perpendicular direction to the peripheral area on the one surface of the substrate at a preset pushing pressure.

With this configuration, the cleaning surface of the first brush is made to contact with the peripheral area on the one surface and the peripheral end face of the substrate. At this time, the pushing pressure of the cleaning surface to the peripheral area on the one surface of the substrate is held at the preset pushing pressure, regardless of the presence or absence of the warp deformation or the like of the substrate, by virtue of the operation of the first pushing pressure holding mechanism. In other words, even if the substrate is deformed by warping, while the cleaning surface of the first brush is in contact with the peripheral area on the one surface and the peripheral end face of the substrate, the first brush is always pushed to the peripheral area on the one surface of the substrate by the preset pushing pressure. Hence, the peripheral area on the one surface and the peripheral end face of the substrate can be cleaned satisfactorily, without causing uneven cleaning or nonuniform cleaning width in the peripheral area on the one surface of the substrate. Furthermore, the cleaning width in the peripheral area on the one surface of the substrate can be changed easily by changing the pushing pressure of the first brush to change the effective contact width of the contact between the cleaning surface and the peripheral area on the one surface of the substrate.

In the first substrate treatment apparatus, the cleaning surface may include a first cleaning surface formed in a shape narrowed toward one side in the perpendicular direction and a second cleaning surface formed in a shape expanding toward the one side in the perpendicular direction from the end edge of the first cleaning surface on the one side. In this case, it is preferable that the controller controls the first brush moving mechanism so that the first cleaning surface is made to contact with the peripheral area on the one surface and the peripheral end face of the substrate held by the substrate holding mechanism and so that the second cleaning surface is made to contact with the peripheral area on the other surface on the opposite side of the one surface and the peripheral end face of the substrate held by the substrate holding mechanism. With this configuration, the peripheral areas on both sides (the one surface and the other surface) and the peripheral end face of the substrate can be cleaned.

The cleaning width in the peripheral area on the other surface of the substrate can be changed easily by changing the pushing amount of the second cleaning surface to the substrate to change the effective contact width between the second cleaning surface and the peripheral area on the other surface of the substrate.

In the first substrate treatment apparatus, the first brush may be formed in a shape tapered toward the one side in the perpendicular direction. In this case, it is preferable that the first substrate treatment apparatus includes a second brush made of an elastically deformable material, formed in a shape tapered toward the opposite side of the one side in the perpendicular direction and having a cleaning surface inclined with respect to the perpendicular direction; and a second brush moving mechanism for moving the second brush with respect to the substrate held by the substrate holding mechanism. In addition, it is preferable that the controller further controls the second brush moving mechanism so that the cleaning surface of the second brush is made to contact with the peripheral area on the other surface on the opposite side of the one surface and the peripheral end face of the substrate held by the substrate holding mechanism. With this configuration, the peripheral area on the other surface and the peripheral end face of the substrate can be cleaned. Furthermore, by carrying out the cleaning of the peripheral area on the other surface and the peripheral end face of the substrate using the second brush along with the cleaning of the peripheral area on the one surface and the peripheral end face of the substrate using the first brush, the peripheral areas on both surfaces and the peripheral end face of the substrate can be cleaned in a short time in comparison with a case in which these cleaning processes are carried out at different timings.

It is preferable that the first substrate treatment apparatus includes a second pushing pressure holding mechanism for holding the pushing pressure of the second brush in the perpendicular direction to the peripheral area on the other surface of the substrate at a preset pushing pressure. The pushing pressure of the second brush to the peripheral area on the other surface of the substrate is held at the preset pushing pressure regardless of the presence or absence of the warp deformation and the like of the substrate, by virtue of the operation of the second pushing pressure holding mechanism. In other words, even if the substrate is deformed by warping, while the cleaning surface of the second brush is in contact with the peripheral area on the other surface and the peripheral end face of the substrate, the second brush is always pushed to the peripheral area on the other surface of the substrate by the preset pushing pressure. Hence, the peripheral area on the other surface and the peripheral end face of the substrate can be cleaned satisfactorily, without causing uneven cleaning or nonuniform cleaning width in the peripheral area on the other surface of the substrate.

A second substrate treatment apparatus according to the present invention includes a substrate holding mechanism for holding a substrate; a first brush made of an elastically deformable material, formed in a shape tapered toward one side in a perpendicular direction perpendicular to one surface of the substrate held by the substrate holding mechanism and having a cleaning surface inclined with respect to the perpendicular direction; a first brush moving mechanism for moving the first brush with respect to the substrate held by the substrate holding mechanism; a second brush made of an elastically deformable material, formed in a shape tapered toward the opposite side of the one side in the perpendicular direction and having a cleaning surface inclined with respect to the perpendicular direction; a second brush moving mechanism for moving the second brush with respect to the substrate held by the substrate holding mechanism; and a controller for controlling the first brush moving mechanism and the second brush moving mechanism so that the cleaning surface of the first brush is made to contact with a peripheral area of the one surface and a peripheral end face of the substrate held by the substrate holding mechanism and the cleaning surface of the second brush is made to contact with a peripheral area on the other surface on the opposite side of the one surface and the peripheral end face of the substrate.

With this configuration, the cleaning surface of the first brush is made to contact with the peripheral area on the one surface and the peripheral end face of the substrate. Furthermore, the cleaning surface of the second brush is made to contact with the peripheral area on the other surface and the peripheral end face of the substrate. Hence, the peripheral areas on both sides and the peripheral end face of the substrate can be cleaned.

In addition, the cleaning width in the peripheral area on the one surface of the substrate can be changed easily by changing the pushing amount of the cleaning surface of the first brush to the substrate (the amount of elastic deformation of the cleaning surface when the cleaning surface of the first brush is made to contact with the substrate) to change the effective contact width between the peripheral area on the one surface of the substrate and the cleaning surface of the first brush. Furthermore, the cleaning width in the peripheral area on the other surface of the substrate can be changed easily by changing the pushing amount of the cleaning surface of the second brush to the substrate (the amount of elastic deformation of the cleaning surface when the cleaning surface of the second brush is made to contact with the substrate) to change the effective contact width between the peripheral area on the other surface of the substrate and the cleaning surface of the second brush.

In the second substrate treatment apparatus, it is preferable that the controller carries out control so that the cleaning surface of the second brush is made to contact with the peripheral area on the other surface and the peripheral end face of the substrate while the cleaning surface of the first brush is made to contact with the peripheral area on the one surface and the peripheral end face of the substrate held by the substrate holding mechanism. With this configuration, the cleaning of the peripheral area on the one surface and the peripheral end face of the substrate using the first brush and the cleaning of the peripheral area on the other surface and the peripheral end face of the substrate using the second brush can be carried out simultaneously. Hence, the peripheral areas on both surfaces and the peripheral end face of the substrate can be cleaned in a short time in comparison with a case in which these cleaning processes are carried out at different timings.

In the first and second substrate treatment apparatuses, the first brush may have a shape rotationally symmetrical around the central axis thereof extending in the perpendicular direction. In this case, it is preferable that the substrate treatment apparatus includes a first brush rotation mechanism for rotating the first brush around the central axis. The peripheral area on the one surface and the peripheral end face of the substrate can be scrubbed by rotating the first brush using the first brush rotation mechanism while the cleaning surface of the first brush is pushed to the peripheral area on the one surface and the peripheral end face of the substrate. Hence, the peripheral area on the one surface and the peripheral end face of the substrate can be cleaned more satisfactorily.

In addition, it is preferable that the first and second substrate treatment apparatuses each include a first brush relative movement mechanism for relatively moving the substrate held by the substrate holding mechanism and the first brush so that the first brush is moved in the circumferential direction of the substrate. By virtue of the relative movement of the first brush and the substrate, the peripheral area on the one surface and the peripheral end face of the substrate can be cleaned efficiently.

In the first and second substrate treatment apparatus, the second brush may have a shape rotationally symmetrical around the central axis extending in the perpendicular direction. In this case, it is preferable that the first and second substrate treatment apparatuses each include a second brush rotation mechanism for rotating the second brush around the central axis. The peripheral area on the other surface and the peripheral end face of the substrate can be scrubbed by rotating the second brush using the second brush rotation mechanism while the cleaning surface of the second brush is pushed to the peripheral area on the other surface and the peripheral end face of the substrate. Hence, the peripheral area on the other surface and the peripheral end face of the substrate can be cleaned more satisfactorily.

In addition, it is preferable that the first and second substrate treatment apparatuses each include a second brush relative movement mechanism for relatively moving the substrate held by the substrate holding mechanism and the second brush so that the second brush is moved in the circumferential direction of the substrate. By virtue of the relative movement of the second brush and the substrate, the peripheral area on the other surface and the peripheral end face of the substrate can be cleaned efficiently.

A third substrate treatment apparatus according to the present invention includes a substrate holding mechanism for holding a substrate; a brush made of an elastically deformable material, and having a first cleaning surface formed in a shape narrowed toward one side in a perpendicular direction perpendicular to one surface of the substrate held by the substrate holding mechanism and a second cleaning surface formed in a shape expanding toward the one side in the perpendicular direction from an end edge of the first cleaning surface on the one side; a brush moving mechanism for moving the brush with respect to the substrate held by the substrate holding mechanism, and a controller for controlling the brush moving mechanism so that the first cleaning surface is made to contact with a peripheral area on the one surface and a peripheral end face of the substrate held by the substrate holding mechanism and the second cleaning surface is made to contact with a peripheral area on the other surface on the opposite side of the one surface and the peripheral end face of the substrate held by the substrate holding mechanism.

With this configuration, the first cleaning surface of the brush is made to contact with the peripheral area on the one surface and the peripheral end face of the substrate. In addition, the second cleaning surface of the brush is made to contact with the peripheral area on the other surface and the peripheral end face of the substrate. Hence, the peripheral areas on the both surfaces and the peripheral end face of the substrate can be cleaned.

In addition, the cleaning width in the peripheral area on the one surface of the substrate can be changed easily by changing the pushing amount of the first cleaning surface to the substrate (the amount of elastic deformation of the first cleaning surface when the first cleaning surface is made to contact with the substrate) to change the effective contact width between the peripheral area on the one surface of the substrate and the first cleaning surface. Furthermore, the cleaning width in the peripheral area on the other surface of the substrate can be changed easily by changing the pushing amount of the second cleaning surface to the substrate (the amount of elastic deformation of the second cleaning surface when the second cleaning surface is made to contact with the substrate) to change the effective contact width between the peripheral area on the other surface of the substrate and the second cleaning surface.

In the third substrate treatment apparatus, the brush may have a shape rotationally symmetrical around the central axis extending in the perpendicular direction. In this case, it is preferable that the third substrate treatment apparatus includes a brush rotation mechanism for rotating the brush around the central axis. The peripheral area on the one surface and the peripheral end face of the substrate can be scrubbed by rotating the brush using the brush rotation mechanism while the first cleaning surface of the brush is pushed to the peripheral area on the one surface and the peripheral end face of the substrate. Furthermore, the peripheral area on the other surface and the peripheral end face of the substrate can be scrubbed by rotating the brush using the brush rotation mechanism while the second cleaning surface of the brush is pushed to the peripheral area on the other surface and the peripheral end face of the substrate. Hence, the peripheral areas on the both surfaces and the peripheral end face of the substrate can be cleaned more satisfactorily.

It is preferable that the third substrate treatment apparatus includes a relative movement mechanism for relatively moving the substrate held by the substrate holding mechanism and the brush so that the brush is moved in the circumferential direction of the substrate. By virtue of the relative movement of the brush and the substrate, the peripheral areas on the both surfaces and the peripheral end face of the substrate can be cleaned efficiently.

In addition, it is preferable that the first to third substrate treatment apparatuses each include a treatment liquid supply mechanism for supplying treatment liquid to an area located more inward than the peripheral area on at least the one surface of the substrate held by the substrate holding mechanism. With the configuration having this treatment liquid supply mechanism, contaminants attached to the area located more inward than the peripheral area on the one surface of the substrate can be cleaned away using the treatment liquid.

A first substrate treatment method according to the present invention includes a substrate holding step for holding a substrate by a substrate holding mechanism; a one-side contact step for moving a first brush having a cleaning surface inclined with respect to a perpendicular direction perpendicular to one surface of the substrate held by the substrate holding mechanism to make the cleaning surface of the first brush in contact with a peripheral area on the one surface and a peripheral end face of the substrate held by the substrate holding mechanism; and a one-side pushing pressure holding step for holding a pushing pressure of the first brush in the perpendicular direction to the peripheral area on the one surface of the substrate at a preset pushing pressure in the one-side contact step.

In the one-side contact step, the cleaning surface of the first brush is made to contact with the peripheral area on the one surface and the peripheral end face of the substrate. At this time, the pushing pressure of the first brush in the perpendicular direction to the peripheral area on the one surface of the substrate is held at the preset pushing pressure. In other words, while the first cleaning surface is in contact with the peripheral area on the one surface and the peripheral end face of the substrate, the first brush is always pushed to the peripheral area on the one surface of the substrate by the preset pushing pressure. Hence, the peripheral area on the one surface and the peripheral end face of the substrate can be cleaned satisfactorily, without causing uneven cleaning or nonuniform cleaning width in the peripheral area on the one surface of the substrate. Furthermore, the cleaning width in the peripheral area on the one surface of the substrate can be changed easily by changing the pushing pressure of the first brush to change the effective contact width between the cleaning surface and the peripheral area on the one surface of the substrate.

In the first substrate treatment method, in the case where the cleaning surface of the first brush includes a first cleaning surface formed in a shape narrowed toward one side in the perpendicular direction and a second cleaning surface formed in a shape expanding toward the one side in the perpendicular direction from the end edge of the first cleaning surface on the one side, the one-side contact step may be a step for making the first cleaning surface in contact with the peripheral area on the one surface and the peripheral end face of the substrate held by the substrate holding mechanism. In such a case, it is preferable that the first substrate treatment method includes an other-side contact step for moving the first brush and making the second cleaning surface in contact with the peripheral area on the other surface on the opposite side of the one surface and the peripheral end face of the substrate held by the substrate holding mechanism. In the one-side contact step, the first cleaning surface of the first brush is made to contact with the peripheral area on the one surface and the peripheral end face of the substrate. In the other-side contact step, the second cleaning surface of the first brush is made to contact with the peripheral area on the other surface and the peripheral end face of the substrate. With this configuration, the peripheral areas on the both sides (the one surface and the other surface) and the peripheral end face of the substrate can be cleaned.

In the first substrate treatment method, in the case where first brush is formed in a shape tapered toward the one side in the perpendicular direction, it is preferable that the first substrate treatment method includes an other-side contact step for moving a second brush formed in a shape tapered toward the opposite side of the one side in the vertical direction and having a cleaning surface inclined with respect to the perpendicular direction and for making the cleaning surface of the second brush in contact with the peripheral area on the other surface on the opposite side of the one surface and the peripheral end face of the substrate held by the substrate holding mechanism, and an other-side pushing pressure holding step for holding the pushing pressure of the second brush in the perpendicular direction to the peripheral area on the other surface of the substrate at a preset pushing pressure in the other-side contact step. By holding the pushing pressure of the second brush to the peripheral area on the other surface of the substrate at the preset pushing pressure in the other-side contact step, the peripheral area on the other surface and the peripheral end face of the substrate can be cleaned satisfactorily, without causing uneven cleaning or nonuniform cleaning width in the peripheral area on the other surface of the substrate, regardless of the presence or absence of the warp deformation of the substrate. Hence, the peripheral areas on the both sides (the one surface and the other surface) and the peripheral end face of the substrate can be cleaned satisfactorily by carrying out the one-side contact step and the other-side contact step. Furthermore, the cleaning width in the peripheral area on the other surface of the substrate can be changed easily by changing the pushing pressure of the second brush to change the effective contact width between the cleaning surface of the second brush and the peripheral area on the other surface of the substrate.

In the first substrate treatment method, the one-side contact step and the other-side contact step may be carried out at the same time. In this case, the peripheral areas on the both surfaces and the peripheral end face of the substrate can be cleaned in a short time in comparison with a case in which these cleaning processes are carried out at different timings.

A second substrate treatment method according to the present invention includes a substrate holding step for holding a substrate by a substrate holding mechanism; a one-side contact step for moving a brush having a first cleaning surface formed in a shape narrowed toward one side in a perpendicular direction perpendicular to one surface of the substrate held by the substrate holding mechanism and a second cleaning surface formed in a shape expanding toward the one side in the perpendicular direction from an end edge of the first cleaning surface on the one side to make the first cleaning surface in contact with a peripheral area on the one surface and a peripheral end face of the substrate held by the substrate holding mechanism; and an other-side contact step for moving the brush to make the second cleaning surface in contact with a peripheral area on the other surface on the opposite side of the one surface and the peripheral end face of the substrate held by the substrate holding mechanism.

In the one-side contact step, the first cleaning surface of the brush is made to contact with the peripheral area on the one surface and the peripheral end face of the substrate. In the other-side contact step, the second cleaning surface of the brush is made to contact with the peripheral area on the other surface and the peripheral end face of the substrate. With this configuration, the peripheral areas on the both sides and the peripheral end face of the substrate can be cleaned.

In addition, the cleaning width in the peripheral area on the one surface of the substrate can be changed easily by changing the pushing amount of the first cleaning surface to the substrate to change the effective contact width between the peripheral area on the one surface of the substrate and the first cleaning surface. Furthermore, the cleaning width in the peripheral area on the other surface of the substrate can be changed easily by changing the pushing amount of the second cleaning surface to the substrate to change the effective contact width between the peripheral area on the other surface of the substrate and the second cleaning surface.

A third substrate treatment method according to the present invention includes a substrate holding step for holding a substrate by a substrate holding mechanism; a one-side contact step for moving a first brush formed in a shape tapered toward one side in a perpendicular direction perpendicular to one surface of the substrate held by the substrate holding mechanism and having a cleaning surface inclined with respect to the perpendicular direction to make the cleaning surface of the first brush in contact with a peripheral area on the one surface and a peripheral end face of the substrate held by the substrate holding mechanism; and an other-side contact step for moving a second brush formed in a shape tapered toward the opposite side of the one side in the perpendicular direction and having a cleaning surface inclined with respect to the perpendicular direction to make the cleaning surface of the second brush in contact with a peripheral area on the other surface on the opposite side of the one surface and the peripheral end face of the substrate held by the substrate holding mechanism, the other-side contact step being carried out along with the one-side contact step.

In the one-side contact step, the cleaning surface of the first brush is made to contact with the peripheral area on the one surface and the peripheral end face of the substrate. In the other-side contact step, the cleaning surface of the second brush is made to contact with the peripheral area on the other surface and the peripheral end face of the substrate. With this configuration, the peripheral areas on the both sides (the one surface and the other surface) and the peripheral end face of the substrate can be cleaned.

Moreover, since the one-side contact step and the other-side contact step are carried out at the same time, the cleaning of the peripheral area on the one surface and the peripheral end face of the substrate using the first brush and the cleaning of the peripheral area on the other surface and the peripheral end face of the substrate using the second brush can be carried out simultaneously. Hence, the peripheral areas on the both surfaces and the peripheral end face of the substrate can be cleaned in a short time in comparison with a case in which these cleaning processes are carried out at different timings.

In addition, the cleaning width in the peripheral area on the one surface of the substrate can be changed easily by changing the pushing amount of the cleaning surface of the first brush to the substrate (the amount of elastic deformation of the cleaning surface when the cleaning surface of the first brush is made to contact with the substrate) to change the effective contact width between the peripheral area on the one surface of the substrate and the cleaning surface of the first brush. On the other hand, the cleaning width in the peripheral area on the other surface of the substrate can be changed easily by changing the pushing amount of the cleaning surface of the second brush to the substrate (the amount of elastic deformation of the cleaning surface when the cleaning surface of the second brush is made to contact with the substrate) to change the effective contact width between the peripheral area on the other surface of the substrate and the cleaning surface of the second brush.

The above-mentioned and other objects, features and effects of the present invention will become apparent from the following descriptions of embodiments by reference to the accompanying drawings.

DETAILED DESCRIPTION OF THE PREFERRED EMBODIMENTS

Embodiments according to the present invention will be described below in detail referring to the accompanying drawings.

Figure 1:
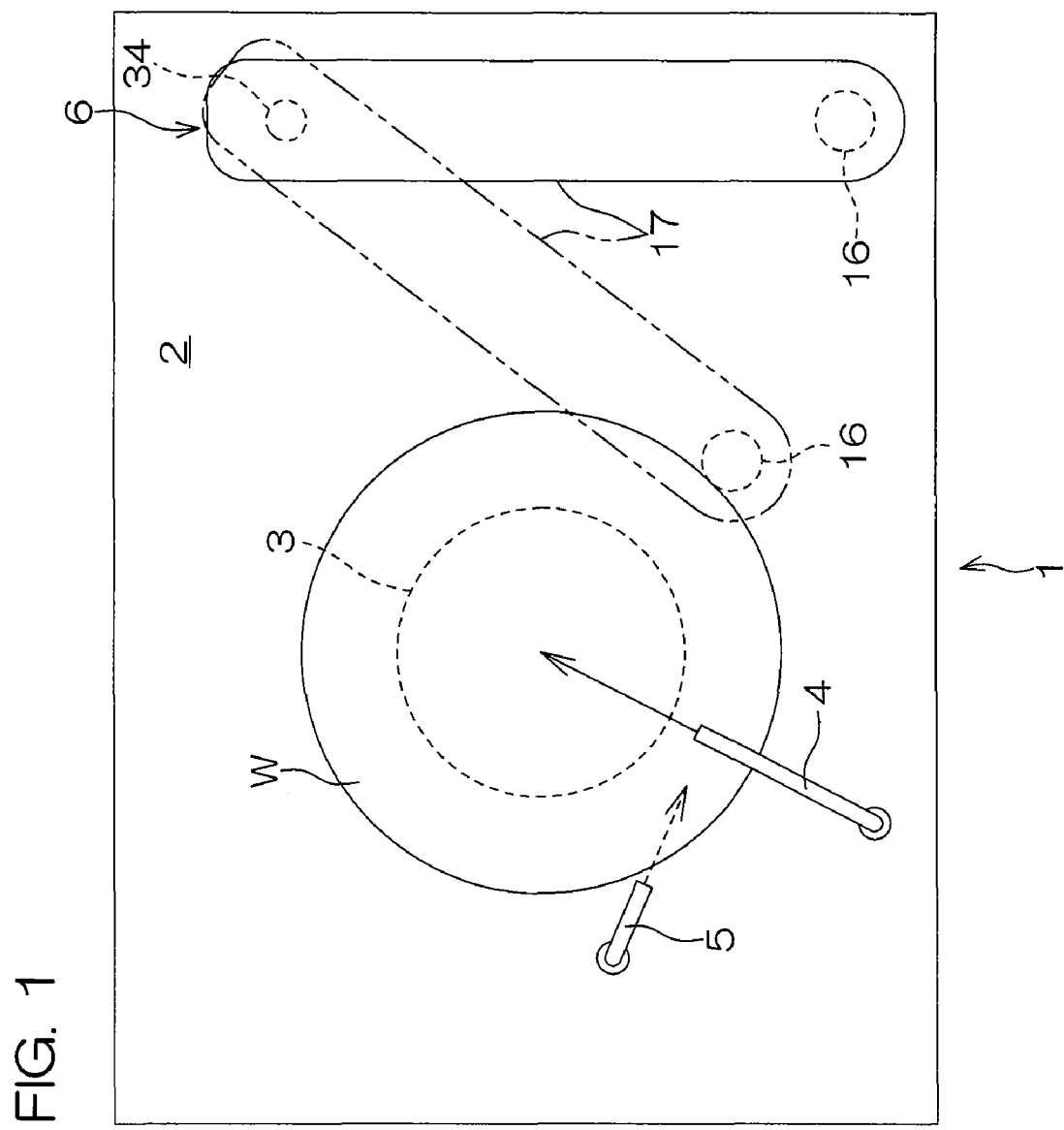
FIG. 1 is a plan view showing the schematic configuration of a substrate treatment apparatus according to an embodiment of the present invention.
Figure 2:
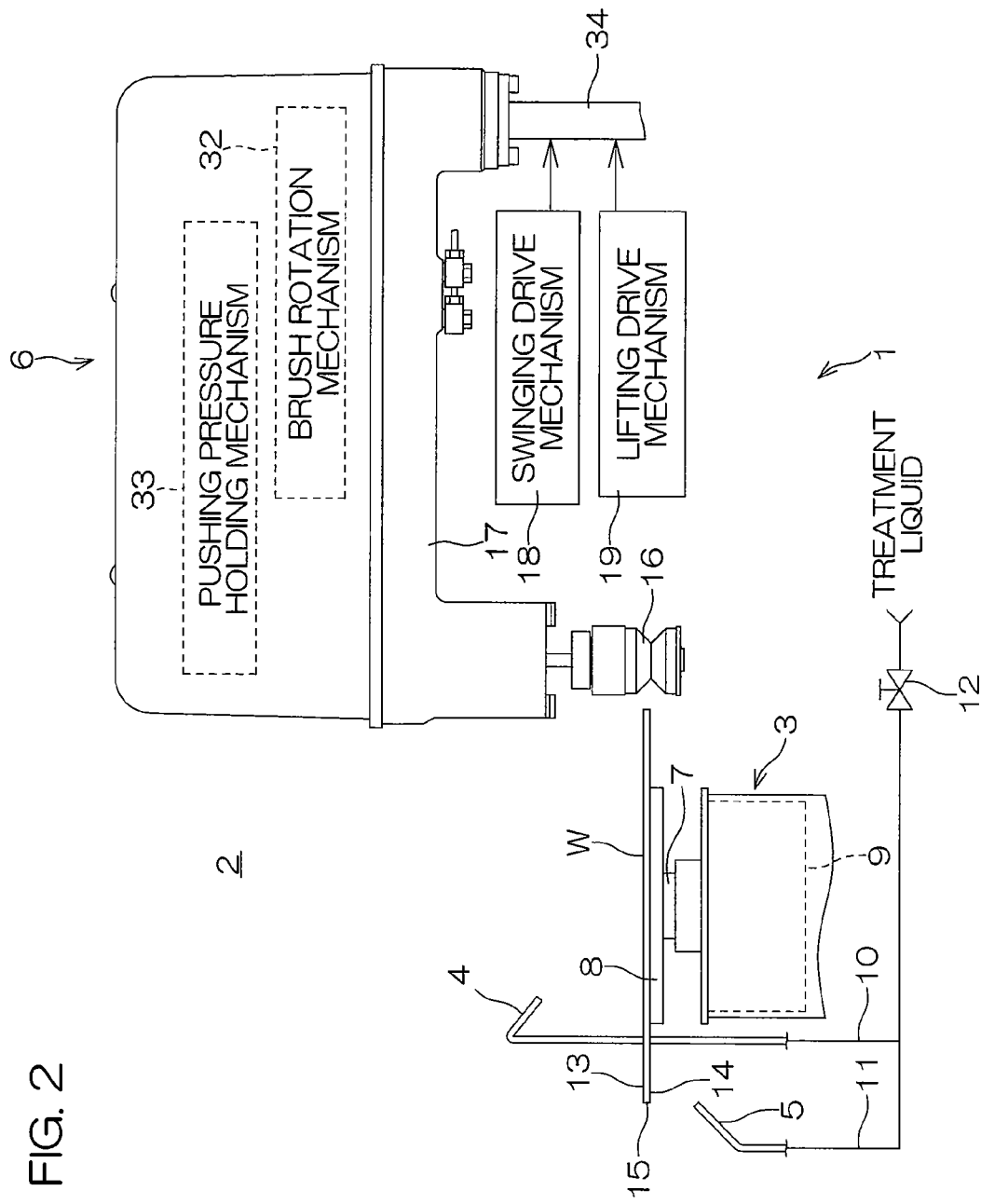
FIG. 2 is an illustrative side view showing the interior of the substrate treatment apparatus shown in FIG. 1.

FIG. 1 is a plan view showing the schematic configuration of a substrate treatment apparatus according to an embodiment of the present invention. FIG. 2 is an illustrative side view showing the interior of the substrate treatment apparatus shown in FIG. 1.

This substrate treatment apparatus 1 is of a single wafer processing type for processing semiconductor wafers W (hereinafter referred to simply as "wafer W") as an example of a substrate one by one. The substrate treatment apparatus 1 includes a spin chuck 3 for holding a wafer W generally horizontally and rotating it, a front surface nozzle 4 for supplying a treatment liquid to the front surface (the surface on which devices are formed) of the wafer W, a back surface nozzle 5 for supplying a treatment liquid to the back surface of the wafer W, and a brushing mechanism 6 for cleaning the peripheral portion of the wafer W, inside a treatment chamber 2 divided by a partition wall.

The spin chuck 3 is a vacuum suction chuck. The spin chuck 3 includes a spin shaft 7 extending in a generally vertical direction, a suction base 8 mounted to the upper end of the spin shaft 7 for sucking and holding the back surface (lower face) of the wafer W in a generally horizontal posture, and a spin motor 9 having a rotation shaft coaxially connected to the spin shaft 7. With this configuration, when the spin motor 9 is driven while the back surface of the wafer W is sucked and held by the suction base 8, the wafer W is rotated around the central axis of the spin shaft 7.

Treatment liquid supply pipes 10 and 11 are connected to the front surface nozzle 4 and the back surface nozzle 5, respectively. To these treatment liquid supply pipes 10 and 11, a treatment liquid is supplied from a treatment liquid supply source not shown via a treatment liquid valve 12. The front surface nozzle 4 discharges the treatment liquid supplied through the treatment liquid supply pipe 10 toward the center of the front surface of the wafer W held by the spin chuck 3. In addition, the back surface nozzle 5 discharges the treatment liquid supplied through the treatment liquid supply pipe 11 toward the area between the peripheral end edge of the back surface of the wafer W held by the spin chuck 3 and the suction base 8.

Pure water is used as the treatment liquid. Instead of pure water, it may be possible to use functional water such as carbonated water, ionized water, ozone water, regenerated water (hydrogen water) or magnetic water, as the treatment liquid. Furthermore, it is also possible to use a chemical liquid, such as ammonia water, or a mixture of ammonia water and a hydrogen peroxide solution, as the treatment liquid.

The brushing mechanism 6 includes a brush 16 for cleaning the peripheral areas 13 and 14 on the front surface and the back surface (for example, ring-shaped areas with a width of 1 to 4 mm from the peripheral edge of the wafer W) and the peripheral end face 15 of the wafer W, a swinging arm 17 holding this brush 16 at the tip end thereof, a swinging drive mechanism 18 for swinging the swinging arm 17 in the horizontal direction around the vertical axis set outside the rotation range of the wafer W, and a lifting drive mechanism 19 for raising and lowering the swinging arm 17.

The peripheral portion of the wafer W is a portion including the peripheral areas 13 and 14 on the front surface and the back surface and the peripheral end face 15 of the wafer W.

Figure 3:
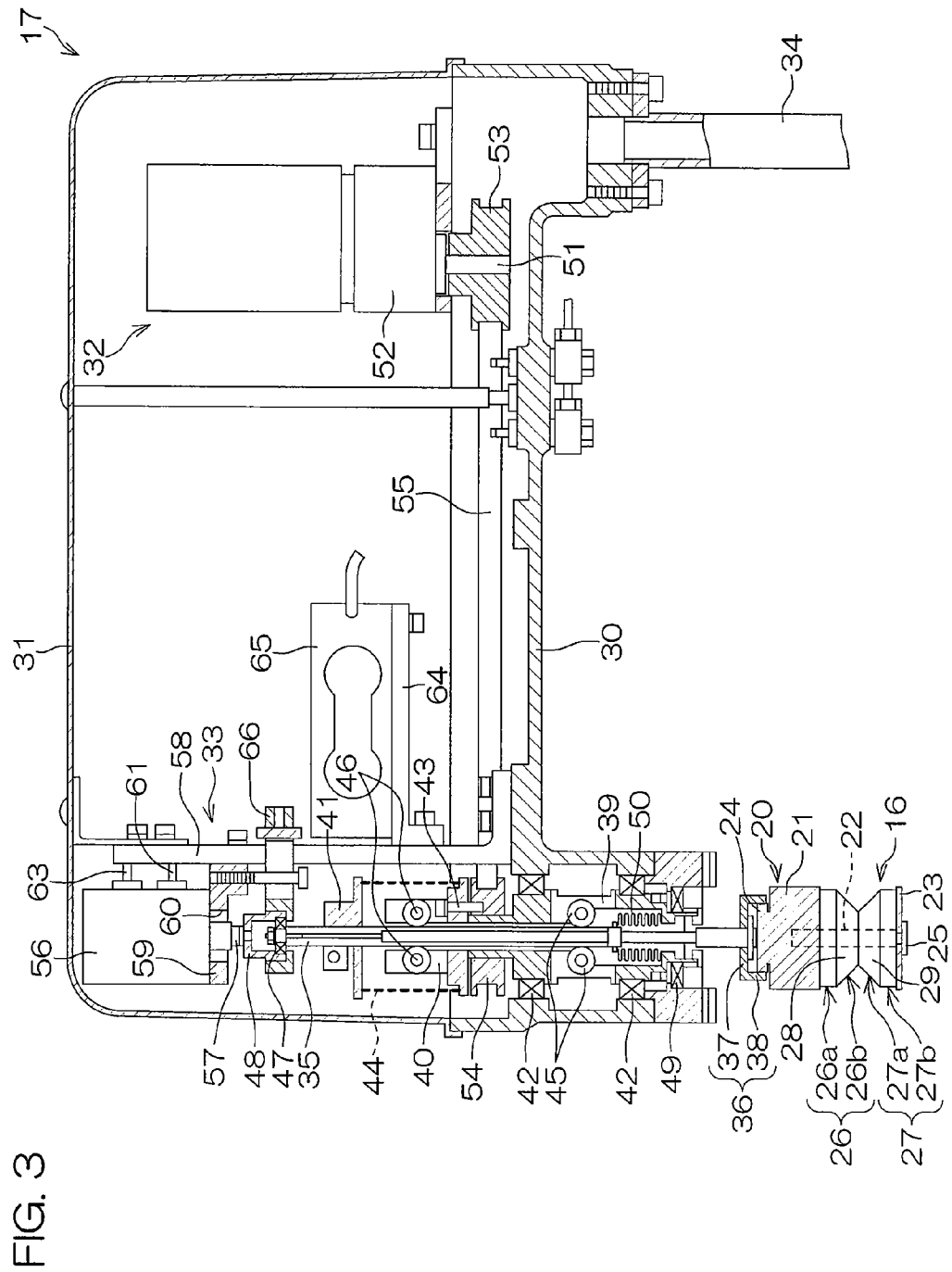
FIG. 3 is a sectional view showing the configurations of a brush and a swinging arm.

FIG. 3 is a sectional view showing the configurations of the brush 16 and the swinging arm 17.

The brush 16 is held by a brush holder 20. The brush holder 20 is mounted to a holder mounting portion 36 described later. The brush holder 20 includes a resin block 21 having a generally cylindrical shape; a core member 22 which is disposed on the central axis of the resin block 21 and the upper end portion of which is inserted into the lower surface of the resin block 21 and fixed thereto; and a plate 23 mounted to the lower end of this core member 22. On the upper surface of the resin block 21, a screw portion 24, the circumferential face of which is provided with a screw thread, is formed integrally. In addition, a screw hole is formed in the lower end portion of the core member 22. A bolt 25 passing through the center of the plate 23 is screwed into the screw hole, whereby the plate 23 is removably mounted to the core member 22.

The brush 16 is made of a sponge material, such as PVA (polyvinyl alcohol). The brush 16 is fitted around the core member 22 and sandwiched between the resin block 21 and the plate 23. The brush 16 is formed into a generally drum-like shape being rotationally symmetrical around the vertical axis. The brush 16 integrally includes a first cleaning portion 26 for cleaning the peripheral area 13 on the front surface and the peripheral end face 15 of the wafer W and a second cleaning portion 27 for cleaning the peripheral area 14 on the back surface and the peripheral end face 15 of the wafer W, and the first cleaning portion 26 and the second cleaning portion 27 are arranged in the vertical direction.

An upper portion 26a of the first cleaning portion 26 has a generally cylindrical shape, and a lower portion 26b thereof has a generally truncated conical shape narrowed downward. The upper end edge of the side surface of the lower portion 26b of the first cleaning portion 26 is continuous with the lower end edge of the side surface of the upper portion 26a, and the side surface of the lower portion 26b is inclined at an inclination angle of 45 degrees with respect to the central axis thereof so as to come closer to the central axis as it approaches the lower portion of itself. In the first cleaning portion 26, the side surface of the lower portion 26b serves as a first cleaning surface 28 making contact with the peripheral area 13 on the front surface and the peripheral end face 15 of the wafer W.

The second cleaning portion 27 is integrally connected to the lower end of the first cleaning portion 26 and disposed so as to have the same central axis as that of the first cleaning portion 26. An upper portion 27a of the second cleaning portion 27 has a generally truncated conical shape expanding downward, and a lower portion 27b thereof has a generally cylindrical shape. The upper end edge of the side surface of the upper portion 27a of the second cleaning portion 27 is continuous with the lower end edge of the side surface of the lower portion 26b of the first cleaning portion 26, and the side surface of the upper portion 27a is inclined at an inclination angle of 45 degrees with respect to the central axis thereof so as to become farther away from the central axis as it approaches the lower portion of itself. Furthermore, the lower end edge of the side surface of the upper portion 27a is continuous with the upper end edge of the side surface of the lower portion 27b. In the second cleaning portion 27, the side surface of the upper portion 27a serves as a second cleaning surface 29 making contact with the peripheral area 14 on the back surface and the peripheral end face 15 of the wafer W.

The swinging arm 17 includes a lower casing 30; an upper casing 31 fitted on the lower casing 30; a brush rotation mechanism 32, disposed in the inner space formed by the lower casing 30 and the upper casing 31, for rotating (rotating around its axis) the brush 16 around the vertical axis line; and a pushing pressure holding mechanism 33, disposed in the inner space formed by the lower casing 30 and the upper casing 31, for holding the pushing pressure of the brush 16 to the peripheral area 13 (the pressure applied when the brush 16 is pushed to the peripheral area 13) on the front surface of the wafer W at a preset pushing pressure.

To one end portion (base end portion) of the lower casing 30, the upper end portion of an arm supporting shaft 34 extending in the vertical direction is connected. To this arm supporting shaft 34, the drive force of the swinging drive mechanism 18 (see FIG. 2) is input. The swinging arm 17 can be swung around the arm supporting shaft 34 by inputting the drive force of the swinging drive mechanism 18 to the arm supporting shaft 34 to reciprocally rotate the arm supporting shaft 34. Furthermore, to the arm supporting shaft 34, the lifting drive mechanism 19 (see FIG. 2) is connected. The swinging arm 17 can be raised and lowered together with the arm supporting shaft 34 by raising and lowering the arm supporting shaft 34 using the lifting drive mechanism 19.

In the other end portion (distal end portion) of the lower casing 30, a rotation shaft 35 extending in the vertical direction is provided so as to be rotatable and movable in the up-and-down direction. The lower end of this rotation shaft 35 protrudes downward from the other end portion of the lower casing 30, and the upper end thereof comes close to the vertical central area of the upper casing 31.

The lower end portion of the rotation shaft 35 protruding from the lower casing 30 is provided with the holder mounting portion 36 on which the brush holder 20 is mounted. The holder mounting portion 36 integrally includes a disc-like upper surface portion 37 through which the rotation shaft 35 is inserted and which is fixed to the rotation shaft 35, and a cylindrical side surface portion 38 extending downward from the peripheral edge of this upper surface portion 37. The inner circumferential surface of the side surface portion 38 is provided with a screw thread. The brush holder 20 can be mounted to the holder mounting portion 36 by screw-engaging the screw thread with the screw thread formed on the threaded portion 24 of the brush holder 20.

In addition, a lower guide roller supporting member 39, an upper guide roller supporting member 40 and a spring hooking member 41 are fitted around the rotation shaft 35.

The lower guide roller supporting member 39 is fitted around the rotation shaft 35 with a very small space from the circumferential surface of the rotation shaft 35 so as to be in a noncontact state. The lower guide roller supporting member 39 is formed in a shape being rotationally symmetrical around the central axis of the rotation shaft 35. The lower guide roller supporting member 39 is rotatably supported by the other end portion of the lower casing 30 via two bearings 42 disposed with a space therebetween. Furthermore, the upper end portion of the lower guide roller supporting member 39 is formed in a cylindrical shape the diameter of which is smaller than that of the portion lower than it. A pulley 54 (described later) of the brush rotation mechanism 32 is fitted on the cylindrical upper end portion so as not to be able to rotate relatively.

The upper guide roller supporting member 40 is provided above the lower guide roller supporting member 39. The upper guide roller supporting member 40 is fitted around the rotation shaft 35 with a very small space from the circumferential surface of the rotation shaft 35 so as to be in a noncontact state. Furthermore, the upper guide roller supporting member 40 is connected to the pulley 54 using bolts 43.

The spring hooking member 41 is provided above the upper guide roller supporting member 40 with a space from the upper guide roller supporting member 40 and is fixed to the rotation shaft 35. One end (upper end) of a coil spring 44 is hooked to the spring hooking member 41. The coil spring 44 is interposed between the spring hooking member 41 and the upper guide roller supporting member 40. The other end (lower end) of the coil spring 44 is hooked to the upper guide roller supporting member 40.

In addition, the lower guide roller supporting member 39 supports a pair of guide rollers 45, and the upper guide roller supporting member 40 supports a pair of guide rollers 46. The guide rollers 45 and 46 are provided so as to be rotatable around shafts extending in a direction orthogonal to the rotation shaft 35 and disposed so that their circumferential surfaces make contact with the circumferential surface of the rotation shaft 35. With this configuration, the up-and-down movement of the rotation shaft 35 can be guided by the guide rollers 45 and 46, and the resistance at the time of the up-and-down movement can be reduced.

On the other hand, a bearing 47 is fitted on the upper end portion of the rotation shaft 35. Via this bearing 47, a cap-shaped contact member 48 is provided so as to be relatively rotatable with respect to the rotation shaft 35.

The space between the outer circumferential surface of the lower guide roller supporting member 39 and the lower casing 30 is sealed by a magnetic fluid seal 49. In addition, the space between the inner circumferential surface of the lower guide roller supporting member 39 and the rotation shaft 35 is sealed by a bellows 50. With this configuration, atmosphere including the treatment liquid and a cleaning liquid is prevented from entering therethrough the inner space formed by the lower casing 30 and the upper casing 31. Furthermore, dust generated inside the inner space is prevented from dispersing into the treatment chamber 2.

At a position nearer to the base end portion of the inside of the upper casing 31, the brush rotation mechanism 32 includes a brush motor 52 the output shaft 51 of which extends downward in the vertical direction. In addition, the brush rotation mechanism 32 includes a pulley 53 fixed to the output shaft 51 of the brush motor 52, the pulley 54 fitted on the lower guide roller supporting member 39, and a belt 55 commonly winding around the circumferential surfaces of the pulley 53 and the pulley 54. With this configuration, when the brush motor 52 is driven, the rotation force from the brush motor 52 is transmitted to the pulley 54 via the pulley 53 and the belt 55. The lower guide roller supporting member 39 and the upper guide roller supporting member 40 are rotated by the rotation force together with the pulley 54. Furthermore, the coil spring 44 and the spring hooking member 41 are rotated by the rotation of the upper guide roller supporting member 40. As a result, the rotation shaft 35 is rotated, and the brush 16 mounted on the lower end of the rotation shaft 35 is rotated.

The pushing pressure holding mechanism 33 includes an air cylinder 56 disposed above the contact member 48. This air cylinder 56 is disposed so that a rod 57 thereof is oriented downward so as to be advanced and retreated in the vertical direction. More specifically, a supporting plate 58 having a generally L shape in side view extends upward from the bottom surface of the lower casing 30. On this supporting plate 58, a cylinder mounting plate 59 extending above the contact member 48 is supported. The air cylinder 56 is fixed to the upper surface of the cylinder mounting plate 59. The rod 57 of the air cylinder 56 is inserted through a rod insertion hole 60 formed in the cylinder mounting plate 59. The lower end of the rod 57 is in contact with the contact member 48.

The interior of the air cylinder 56 is divided into two spaces in the advance/retreat direction (vertical direction) of the rod 57 by a piston (not shown) fixed to the base end of the rod 57. To the space on the side of the rod 57 with respect to the piston, a first air supply pipe 61 includes a continuous flow valve (not shown) disposed in the inside thereof is connected. On the other hand, to the space on the opposite side of the rod 57 with respect to the piston, a second air supply pipe 63 includes a relief valve 62 (see FIG. 4) disposed in the inside thereof is connected, and the relief valve 62 is capable of changing the setting of the relief pressure thereof. When the relief pressure of the relief valve 62 is raised, the pressure of the air supplied from the second air supply pipe 63 to the air cylinder 56 rises, and the rod 57 advances from the air cylinder 56. On the other hand, when the relief pressure of the relief valve 62 is lowered, the pressure of the air supplied from the second air supply pipe 63 to the air cylinder 56 lowers, and the rod 57 retreats in the air cylinder 56 by virtue of the pressure of the air supplied from the first air supply pipe 61 to the air cylinder 56 and the urging force of the coil spring 44.

Furthermore, on the supporting plate 58, a sensor mounting plate 64 extending to the opposite side of the cylinder mounting plate 59 is supported. On the upper surface of this sensor mounting plate 64, a strain gauge type pressure sensor 65 is mounted.

On the other hand, a pushing pressure detection arm 66 is fixed to the contact member 48. This pushing pressure detection arm 66 extends from the contact member 48 above the pressure sensor 65. In a state in which the brush 16 is not in contact with the wafer W, the pushing pressure detection arm 66 makes contact with the pressure sensor 65 with the pushing pressure exerted downward in the vertical direction to the rotation shaft 35 by the air cylinder 56 (corresponding to the pushing pressure of the brush 16 in the vertical direction to the peripheral area 13 on the front surface of the wafer W). With this configuration, the pressure sensor 65 can detect the pushing down pressure exerted downward in the vertical direction to the rotation shaft 35 by the air cylinder 56.

Figure 4:
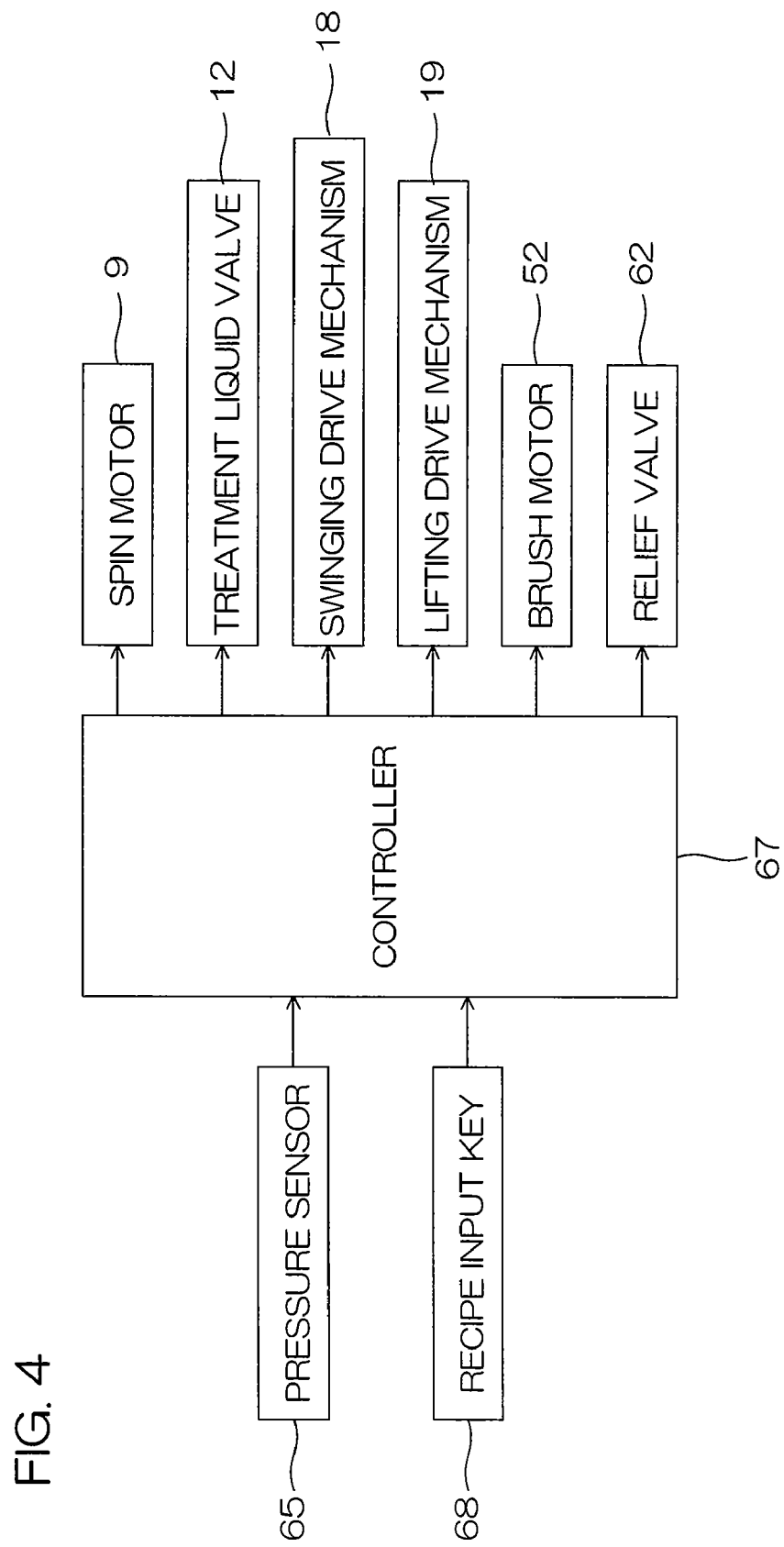
FIG. 4 is a block diagram illustrating the electrical configuration of the substrate treatment apparatus shown in FIG. 1.

FIG. 4 is a block diagram illustrating the electrical configuration of the substrate treatment apparatus 1.

The substrate treatment apparatus 1 includes a controller 67 including a microcomputer. To this controller 67, the detection signal of the pressure sensor 65 is input. In addition, to the controller 67, a recipe input key 68 for allowing the user to input a treatment recipe (various conditions for treating the wafer W) is connected. Furthermore, to the controller 67, the spin motor 9, the treatment liquid valve 12, the swinging drive mechanism 18, the lifting drive mechanism 19, the brush motor 52, the relief valve 62, etc., are connected as objects to be controlled.

Figure 5:
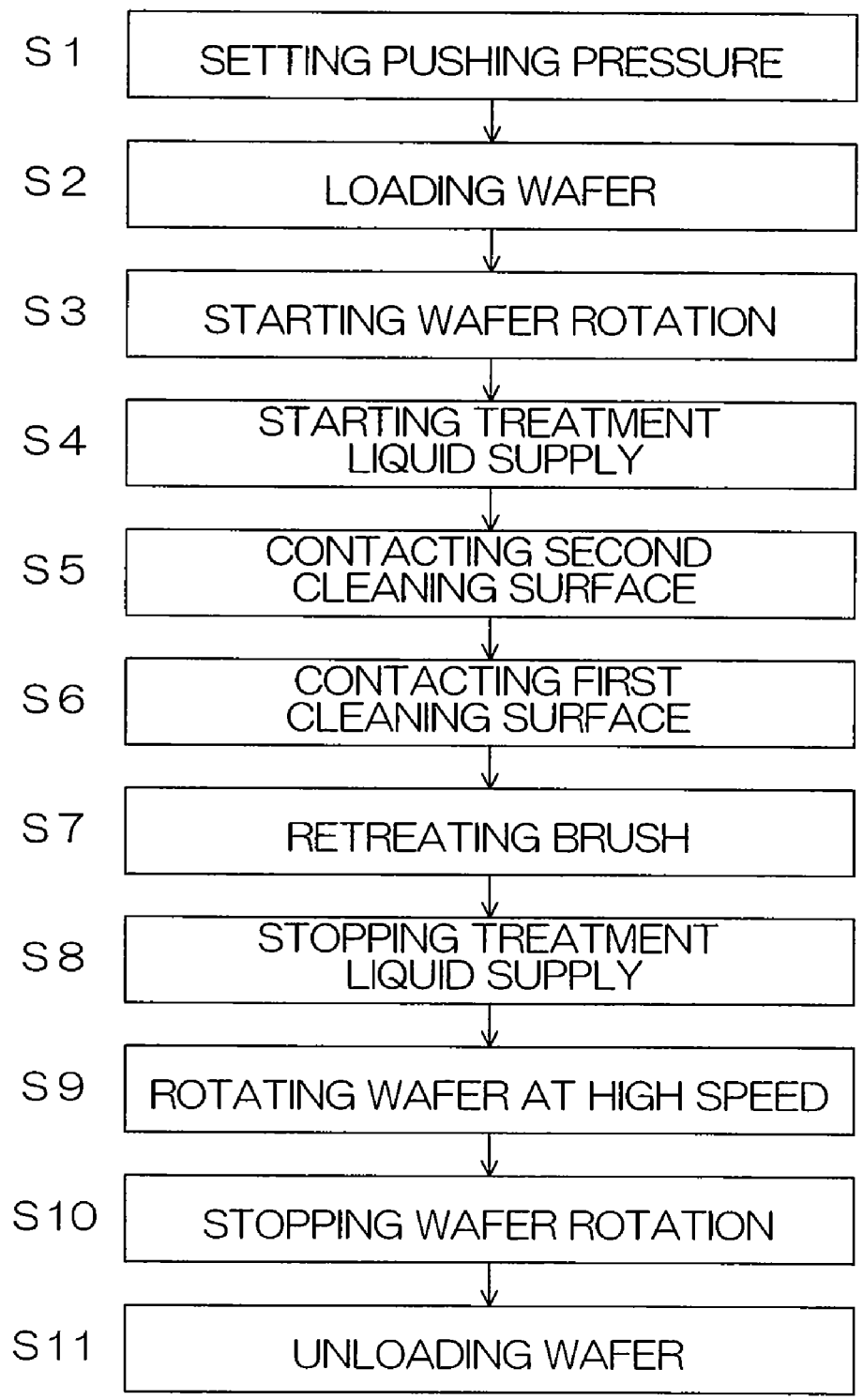
FIG. 5 is a process chart for explaining treatment in the substrate treatment apparatus shown in FIG. 1.
Figure 6:
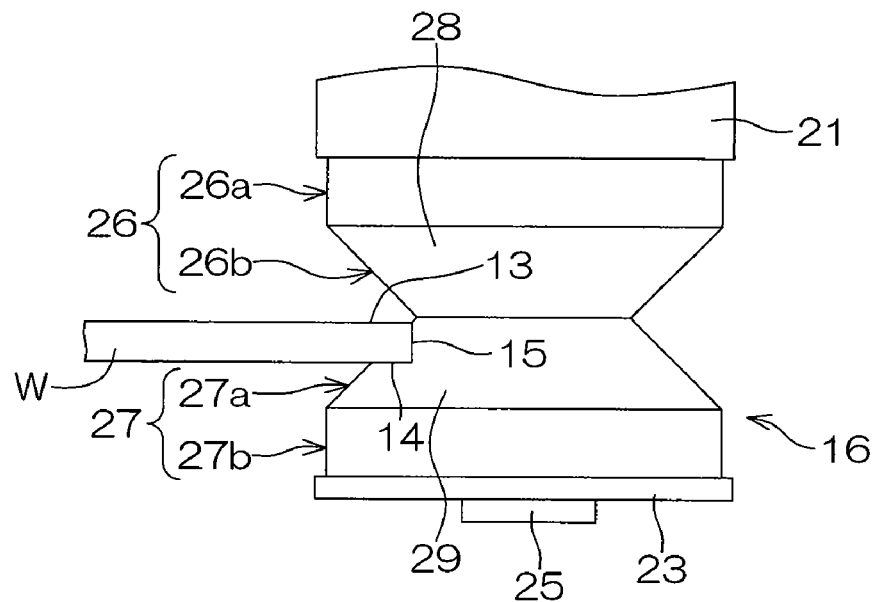
FIG. 6 is a side view showing a state of a brush (the second cleaning surface thereof making contact with the peripheral portion of a substrate) during the treatment.
Figure 7:
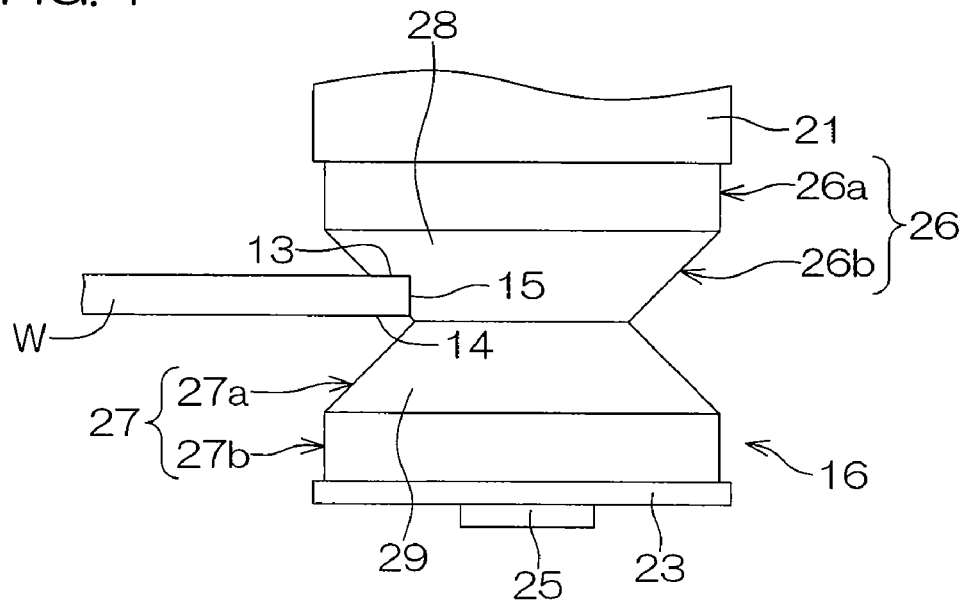
FIG. 7 is a side view showing a state of the brush (the first cleaning surface thereof making contact with the peripheral portion of the substrate) during the treatment.

FIG. 5 is a process chart for explaining the treatment of the wafer W in the substrate treatment apparatus 1. FIG. 6 and FIG. 7 are side views showing the states of the brush 16 during the treatment of the wafer W.

Before the wafer W is treated, the recipe input key 68 is operated by the user, and the pushing pressure of the first cleaning surface 28 of the brush 16 to the peripheral area 13 on the front surface of the wafer W is input. According to the input from the recipe input key 68, the relief pressure of the relief valve 62 is set by the controller 67 (step S1: setting pushing pressure). More specifically, when the brush 16 is not in contact with the wafer W, the pushing pressure detection arm 66 is in contact with the pressure sensor 65. Hence, the pressure sensor 65 can detect the pushing down pressure exerted downward in the vertical direction to the rotation shaft 35 by the air cylinder 56. The controller 67 changes the relief pressure of the relief valve 62, compares the pushing down pressure detected by the pressure sensor 65 with the pushing pressure input from the recipe input key 68. When the two pressures become equal, the relief pressure at this time is set as the relief pressure for the treatment of the wafer W.

The wafer W loaded into the treatment chamber 2 is held by the spin chuck 3 (step S2). Then, the spin motor 9 is controlled by the controller 67, and the rotation of the wafer W by the spin chuck 3 is started (step S3). Next, the treatment liquid valve 12 is opened by the controller 67, and the supply of the treatment liquid from the front surface nozzle 4 and the back surface nozzle 5 to the front surface and the back surface of the wafer W, respectively, is started (step S4).

In addition, the brush motor 52 is controlled by the controller 67, and the brush 16 is rotated in the same rotation direction as that of the wafer W. Then, the swinging drive mechanism 18 and the lifting drive mechanism 19 are controlled by the controller 67, and the second cleaning surface 29 of the brush 16 is made to contact with the peripheral area 14 on the back surface and the peripheral end face 15 of the wafer W (step S5). More specifically, first, the lifting drive mechanism 19 is controlled, and the brush 16 is moved to a height position corresponding to the pushing amount set by the recipe input key 68. By this movement, the second cleaning surface 29 of the brush 16 is opposed to the peripheral end face 15 of the wafer W. Next, the swinging drive mechanism 18 is controlled, the swinging arm 17 is swung, and the brush 16 is moved horizontally. By virtue of this horizontal movement, the peripheral portion of the wafer W bites into the second cleaning surface 29 of the brush 16, and the second cleaning surface 29 of the brush 16 is pushed to the peripheral area 14 on the back surface and the peripheral end face 15 of the wafer W as shown in FIG. 6. As a result, the peripheral area 14 on the back surface and the peripheral end face 15 of the wafer W are cleaned.

When a predetermined time has passed after the second cleaning surface 29 of the brush 16 makes contact with the wafer W, the lifting drive mechanism 19 is controlled by the controller 67, and the brush 16 is raised to a predetermined height. By virtue of this rising, the peripheral portion of the wafer W bites into the first cleaning surface 28 of the brush 16 (step S6: contacting first cleaning surface), and the first cleaning surface 28 of the brush 16 is pushed to the peripheral area 13 on the front surface and the peripheral end face 15 of the wafer W as shown in FIG. 7. As a result, the peripheral area 13 on the front surface and the peripheral end face 15 of the wafer W are cleaned.

At this time, by virtue of the operation of the pushing pressure holding mechanism 33, the brush 16 is pushed to the peripheral area 13 on the front surface of the wafer W with the constant pushing pressure set by the recipe input key 68. For example, when the wafer W is deformed by warping, if the brush 16 makes contact with the portion of the wafer W deformed upward by warping, a force for pushing the brush 16 upward is exerted. Then, the pressure in the space on the opposite side of the rod 57 with respect to the piston inside the air cylinder 56 rises, and the pressure inside the second air supply pipe 63 rises accordingly. If the pressure inside the air supply pipe 63 becomes equal to or higher than the relief pressure of the relief valve 62, the air inside the second air supply pipe 63 is released, and the pressure inside the second air supply pipe 63 is held at the relief pressure. Hence, while the first cleaning surface 28 of the brush 16 is in contact with the peripheral area 13 on the front surface and the peripheral end face 15 of the wafer W, the pushing pressure of the brush 16 in the vertical direction to the peripheral area 13 on the front surface of the wafer W is held at the preset pushing pressure.

Furthermore, while the peripheral portion of the wafer W is cleaned, contaminants attached to the central area (device forming area) on the front surface of the wafer W can be cleaned away by the treatment liquid supplied to the front surface of the wafer W.

When a predetermined time has passed after the first cleaning surface 28 of the brush 16 makes contact with the wafer W, the swinging drive mechanism 18 and the lifting drive mechanism 19 are controlled by the controller 67, and the brush 16 is retreated to its home position at which the brush 16 is located before the start of the treatment (step S7). In addition, while the brush 16 is returned to its home position, the brush motor 52 is stopped, and the rotation of the brush 16 is stopped. Furthermore, the treatment liquid valve 12 is closed by the controller 67, and the supply of the treatment liquid from the front surface nozzle 4 and the back surface nozzle 5 is stopped (step S8).

Then, the spin motor 9 is controlled by the controller 67, and the wafer W is rotated at a high speed (for example, 3000 rpm) (step S9). Hence, the treatment liquid attached to the wafer W is spun off, and the wafer W can be dried.

After the high-speed rotation of the wafer W is continued for a predetermined time, the spin motor 9 is stopped, and the rotation of the wafer W by the spin chuck 3 is stopped (step S10). Then, after the wafer W becomes stationary, the wafer W having been treated is unloaded from the treatment chamber 2 (step S11).

As described above, the second cleaning surface 29 of the brush 16 is made to contact with the peripheral area 14 on the back surface and the peripheral end face 15 of the wafer W, therefore the peripheral area 14 and the peripheral end face 15 can be cleaned. Furthermore, the first cleaning surface 28 of the brush 16 is made to contact with the peripheral area 13 on the front surface and the peripheral end face 15 of the wafer W, therefore the peripheral area 13 and the peripheral end face 15 can be cleaned.

While the first cleaning surface 28 of the brush 16 is in contact with the peripheral area 13 on the front surface and the peripheral end face 15 of the wafer W, the pushing pressure of the brush 16 in the vertical direction to the peripheral area 13 on the front surface of the wafer W is held at the preset pushing pressure by virtue of the operation of the pushing pressure holding mechanism 33. Hence, even if the wafer W is deformed by warping, the peripheral area 13 on the front surface and the peripheral end face 15 of the wafer W can be cleaned satisfactorily, without causing uneven cleaning or nonuniform cleaning width in the peripheral area 13 on the front surface of the wafer W.

In addition, the cleaning width in the peripheral area 13 can be changed easily by changing the pushing amount of the first cleaning surface 28 of the brush 16 to the wafer W (the amount of elastic deformation of the first cleaning surface 28 when the first cleaning surface 28 is made to contact with the wafer W) to change the effective contact width between the peripheral area 13 on the one surface of the wafer W and the first cleaning surface 28. Furthermore, the cleaning width in the peripheral area 14 can be changed easily by changing the pushing amount of the second cleaning surface 29 of the brush 16 to the wafer W (the amount of elastic deformation of the second cleaning surface 29 when the second cleaning surface 29 is made to contact with the wafer W) to change the effective contact width between the peripheral area 14 on the other surface of the wafer W and the second cleaning surface 29.

Further, since the cleaning by the first cleaning surface 28 is carried out after the cleaning by the second cleaning surface 29 has been carried out, even if the contaminants removed from the peripheral area 14 on the back surface and the peripheral end face 15 of the wafer W are carried around to the front surface of the wafer W and attached thereto during the cleaning by the second cleaning surface 29, the contaminants attached again to the front surface of the wafer W can be removed when the cleaning by the first cleaning surface 28 is carried out. As a result, the wafer W having a clean front surface can be provided.

After the treatment in the substrate treatment apparatus 1, the back surface of the wafer W is cleaned in another substrate treatment apparatus (treatment chamber) to remove contaminants (suction traces) attached to the contact portion between the back surface and the suction base 8 of the spin chuck 3. Hence, even if the contaminants removed from the peripheral area 13 on the front surface and the peripheral end face 15 of the wafer W are carried around to the back surface of the wafer W and attached thereto during the cleaning using the first cleaning surface 28, no problem occurs.

In addition, while the first cleaning surface 28 of the brush 16 is in contact with the wafer W and while the second cleaning surface 29 of the brush 16 is in contact with the wafer W, the wafer W is rotated by the spin chuck 3, and the brush 16 and the peripheral portion of the wafer W are moved relatively, whereby the peripheral portion of the wafer W can be cleaned efficiently.

Furthermore, while the first cleaning surface 28 of the brush 16 is in contact with the wafer W and while the second cleaning surface 29 of the brush 16 is in contact with the wafer W, the brush 16 is rotated in the same direction as that of the wafer W. Hence, the peripheral portion of the wafer W can be scrubbed, and the peripheral portion of the wafer W can be cleaned more satisfactorily. The rotation direction of the brush 16 may be opposite to the rotation direction of the wafer W. However, when the rotation direction is the same as that of the wafer W, the wafer W and the brush 16 can be rubbed with each other. As a result, cleaning with higher quality can be attained.

Figure 8:
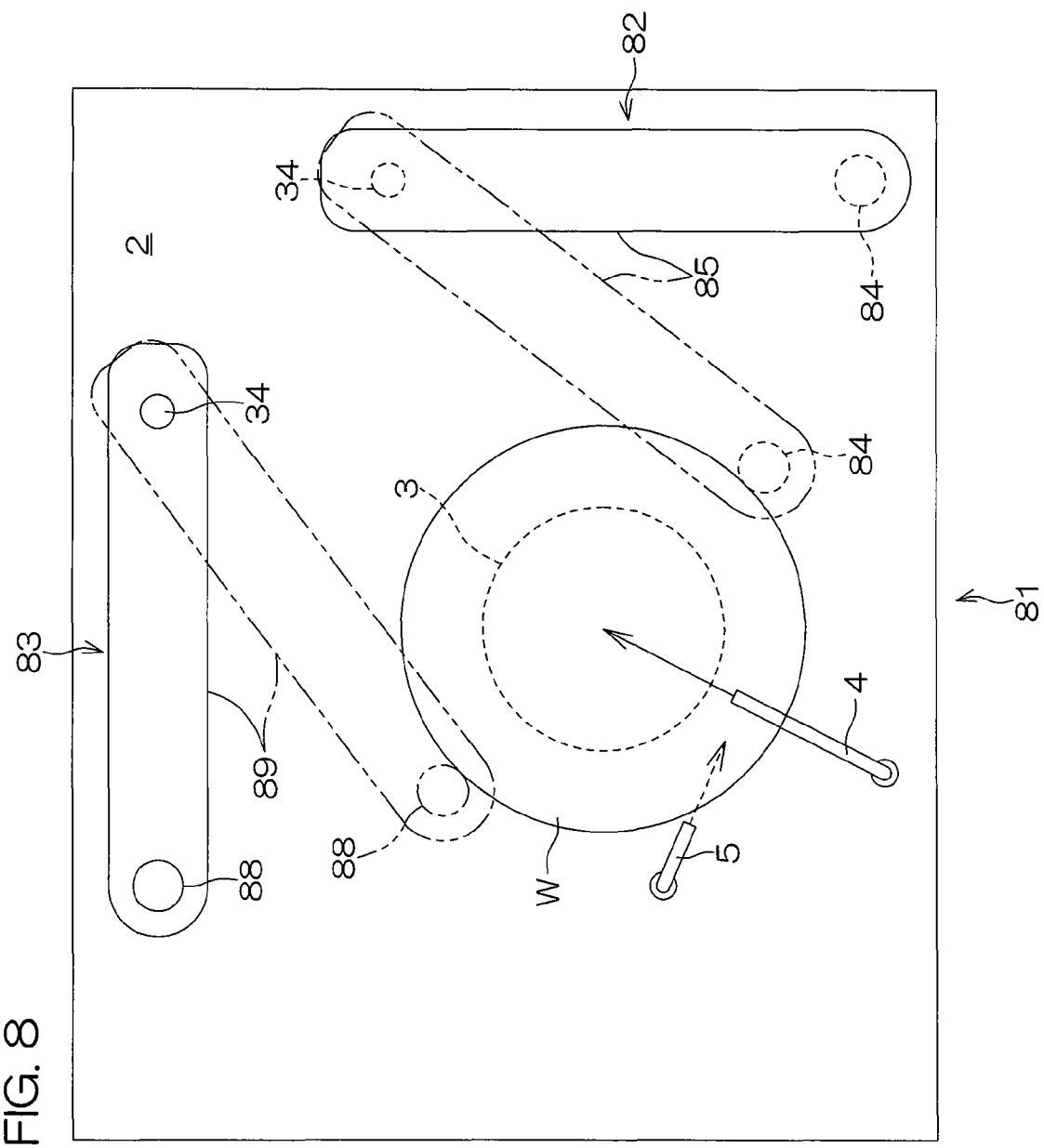
FIG. 8 is a plan view showing the schematic configuration of a substrate treatment apparatus according to another embodiment of the present invention.
Figure 9:
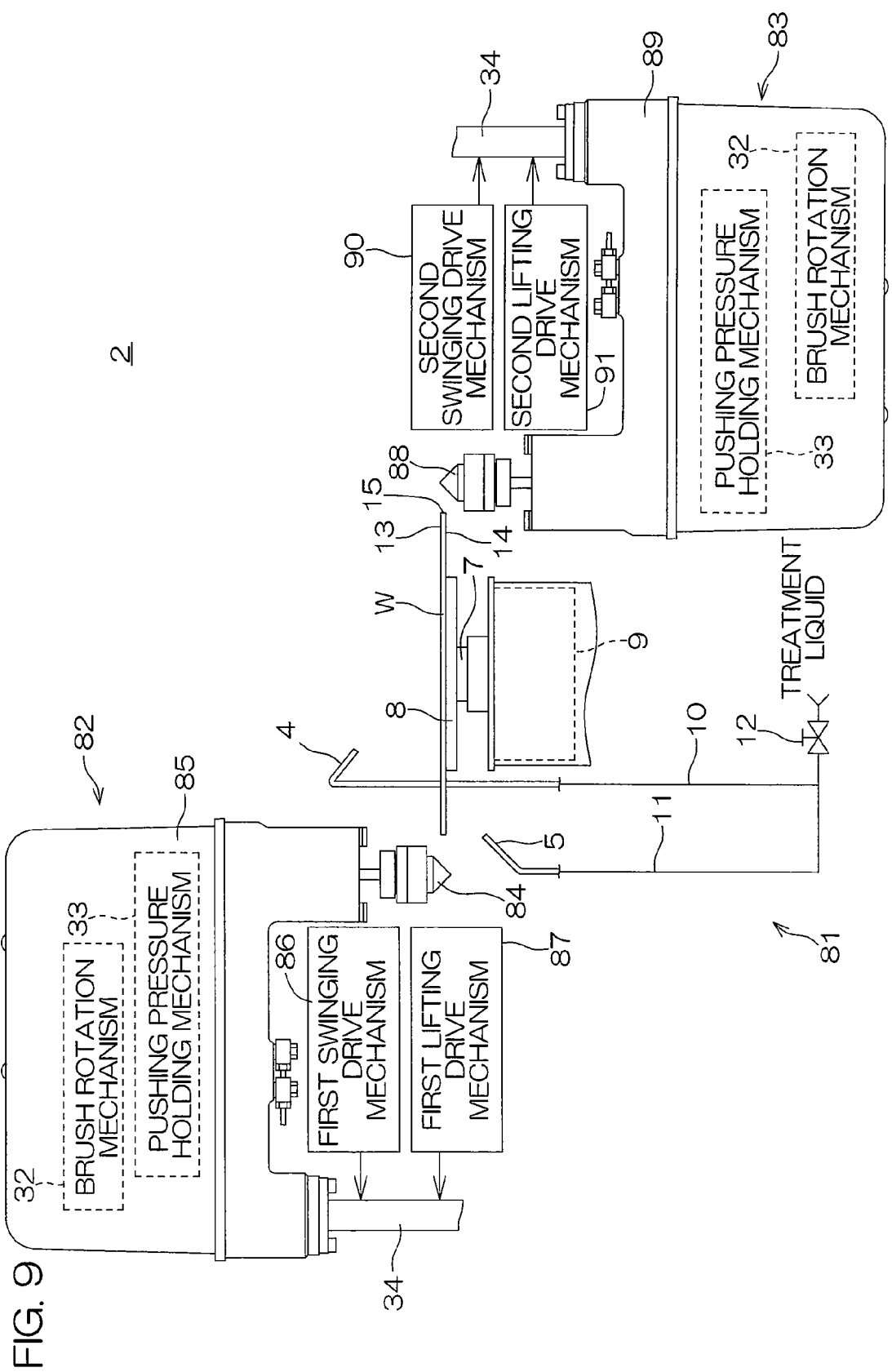
FIG. 9 is an illustrative side view showing the interior of the substrate treatment apparatus shown in FIG. 8.

FIG. 8 is a plan view showing the schematic configuration of a substrate treatment apparatus according to another embodiment of the present invention. FIG. 9 is an illustrative side view showing the interior of the substrate treatment apparatus shown in FIG. 8. In FIG. 8 and the following figures, components corresponding to the components shown in FIG. 1 to FIG. 7 are designated using the same reference numerals as those of the components shown in FIG. 1 to FIG. 7.

This substrate treatment apparatus 81 includes a spin chuck 3 for holding a wafer W generally horizontally and rotating it, a front surface nozzle 4 for supplying treatment liquid to the front surface of the wafer W, a back surface nozzle 5 for supplying treatment liquid to the back surface of the wafer W, a first brushing mechanism 82 for cleaning the peripheral area 13 on the front surface and the peripheral end face 15 of the wafer W, and a second cleaning mechanism 83 for cleaning the peripheral area 14 on the back surface and the peripheral end face 15 of the wafer W, inside a treatment chamber 2.

The first brushing mechanism 82 includes a first brush 84 for cleaning the peripheral area 13 on the front surface and the peripheral end face 15 of the wafer W, a first swinging arm 85 for holding this first brush 84 at the tip end thereof, a first swinging drive mechanism 86 for swinging the first swinging arm 85 in the horizontal direction around the vertical axis set outside the rotation range of the wafer W, and a first lifting drive mechanism 87 for raising and lowering the first swinging arm 85.

The second brushing mechanism 83 includes a second brush 88 for cleaning the peripheral area 14 on the back surface and the peripheral end face 15 of the wafer W, a second swinging arm 89 for holding this second brush 88 at the tip end thereof, a second swinging drive mechanism 90 for swinging the second swinging arm 89 in the horizontal direction around the vertical axis set outside the rotation range of the wafer W, and a second lifting drive mechanism 91 for raising and lowering the second swinging arm 89.

The first swinging arm 85 has the same configuration as that of the swinging arm 17 described above. The second swinging arm 89 has a configuration obtained by vertically reversing the swinging arm 17 described above. Hence, the first swinging arm 85 and the second swinging arm 89 are not described in detail. In the following descriptions, the components of the first swinging arm 85 and the second swinging arm 89 corresponding to those of the swinging arm 17 are designated by the same reference numerals as those of the components of the swinging arm 17.

Figure 10:
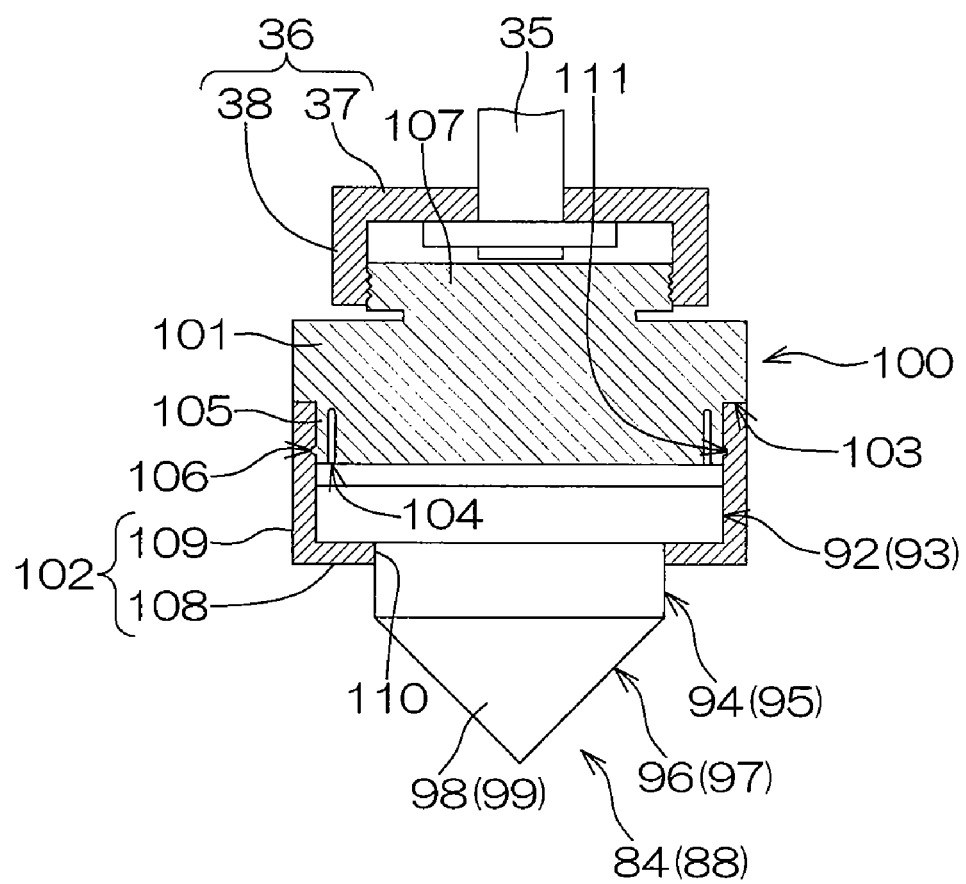
FIG. 10 is a sectional view showing the configuration of a first brush.

FIG. 10 is a sectional view showing the configuration of the first brush 84.

The first brush 84 and the second brush 88 have the same configuration and are held by the first swinging arm 85 and the second swinging arm 89, respectively, in a state of being vertically reversed from each other. In the following descriptions, the configuration of the first brush 84 is mainly described, and the reference numerals designating the components of the second brush 88 corresponding to those of the first brush 84 are put in parentheses and added after the reference numerals designating the components of the first brush 84, for the sake of simplicity.

The first brush 84 (the second brush 88) is made of a sponge material, such as PVA (polyvinyl alcohol), and integrally includes a base portion 92 (93) having a generally disc-like shape; a body portion 94 (95) provided on one surface of this base portion 92 (93) and having a generally disc-like shape (flat columnar shape) the diameter of which is smaller than that of the base portion 92 (93); and a tip end portion 96 (97) provided at the tip end of this body portion 94 (95) and having a generally conical shape. The base portion 92 (93), the body portion 94 (95) and the tip end portion 96 (97) have the same central axis, and the first brush 84 has a shape being rotationally symmetrical around the central axis. Furthermore, the side surface of the tip end portion 96 (97) is a conical surface connected to the side surface of the body portion 94 (95), and serves as a cleaning surface 98 (99) making contact with the peripheral area 13 (14) and the peripheral end face 15 of the wafer W.

The first brush 84 (the second brush 88) is held by a brush holder 100 and mounted to the holder mounting portion 36 of the first swinging arm 85 (the second swinging arm 89) via this brush holder 100. The brush holder 100 includes a resin block 101 having a generally columnar shape and a fixing member 102 for fixing the first brush 84 (the second brush 88) to this resin block 101.

A fitting groove 103 having a generally rectangular shape in section is formed around the entire circumference of the circumferential surface of one end portion of the resin block 101. In addition, on the one end portion of the resin block 101, a slit groove 104 having a generally U shape in section is formed in the circumferential direction at a position spaced away from the fitting groove 103 with a very small distance inward in the radial direction. With this configuration, the portion between the fitting groove 103 and the slit groove 104 serves as an elastic piece 105 to which the elasticity due to the flexibility of the resin is given. On the outer circumferential surface of this elastic piece 105, a plurality of hemispherical engaging protrusions 106 are formed. On the other hand, on the end surface on the other side of the resin block 101, a flat columnar screw portion 107 is formed integrally. On the circumferential surface of this screw portion 107, a screw is formed which can be screw-engaged with the screw thread formed in the holder mounting portion 36.

The fixing member 102 integrally includes a disc portion 108 having a generally circular outer shape and a cylindrical portion 109 having a generally cylindrical shape and extending from the peripheral edge of this disc portion 108 to one side thereof. At the central portion of the disc portion 108, an insertion hole 110 for allowing the body portion 94 (95) of the first brush 84 (the second brush 88) to insert therethrough is formed. The inner diameter of the cylindrical portion 109 is generally equal to the outer diameter of the base portion 92 (93) of the first brush 84 (the second brush 88). In addition, the inner diameter of the cylindrical portion 109 is made slightly smaller than the outer diameter of the elastic piece 105 when no external force is applied to the elastic piece 105. On the inner circumferential surface of the cylindrical portion 109, a plurality of engaging concave portions 111 that can be engaged with the respective engaging protrusions 106 are formed.

When the first brush 84 (the second brush 88) is mounted to the holder mounting portion 36, first, the first brush 84 (the second brush 88) is mounted on the fixing member 102 so that the body portion 94 (95) is inserted through the insertion hole 110 and the base portion 92 (93) is accommodated inside the cylindrical portion 109. Then, the cylindrical portion 109 of the fixing member 102 is fitted in the fitting groove 103 of the resin block 101, and the engaging protrusions 106 are engaged with the engaging concave portions 111, respectively. As a result, the first brush 84 (the second brush 88) is held by the brush holder 100. Then the screw portion 107 of the brush holder 100 is screw-engaged with the holder mounting portion 36, whereby mounting of the first brush 84 (the second brush 88) to the holder mounting portion 36 is achieved.

Figure 11:
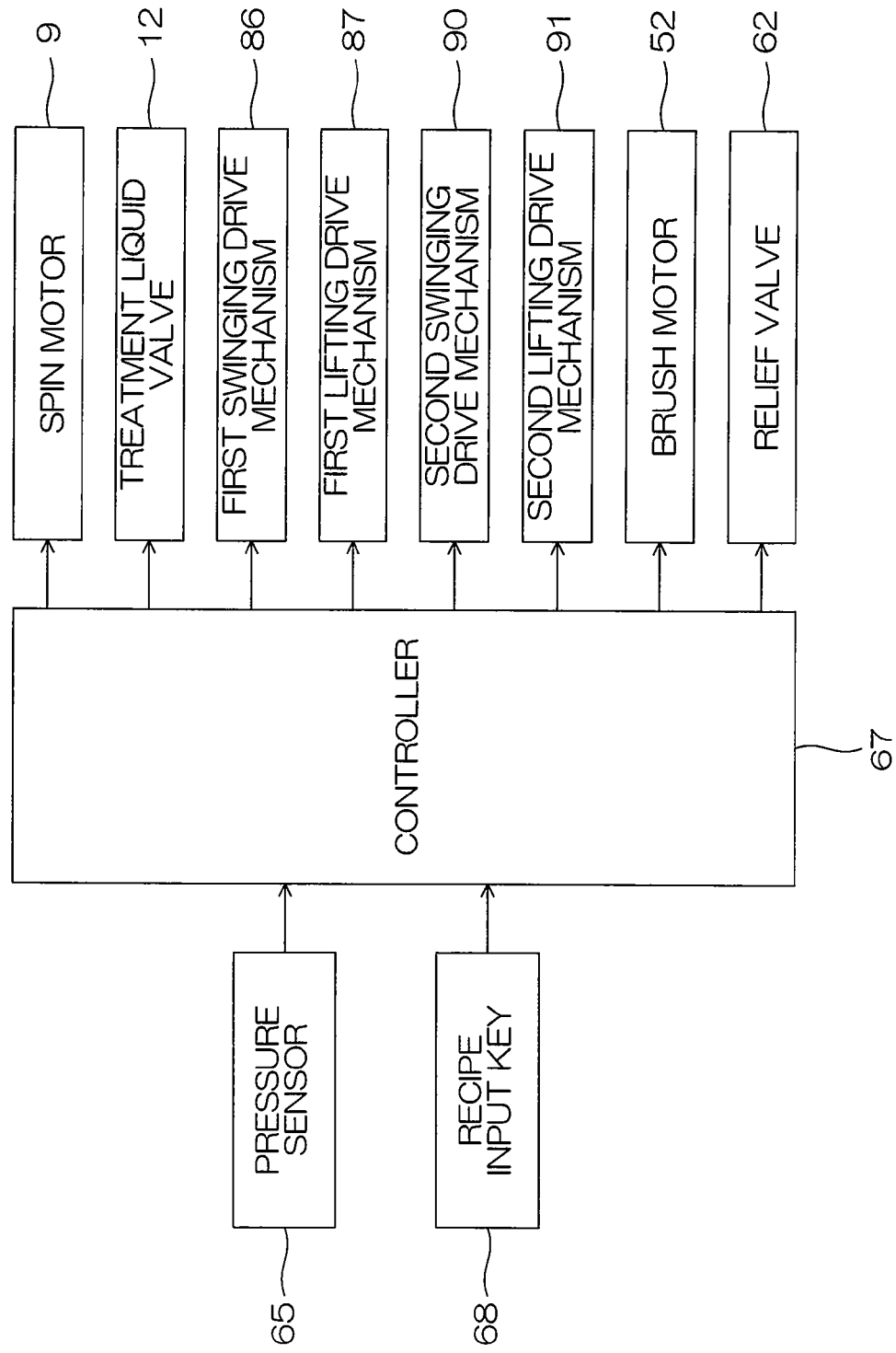
FIG. 11 is a block diagram illustrating the electrical configuration of the substrate treatment apparatus shown in FIG. 8.

FIG. 11 is a block diagram illustrating the electrical configuration of the substrate treatment apparatus 81.

The spin motor 9, the treatment liquid valve 12, the first swinging drive mechanism 86, the first lifting drive mechanism 87, the second swinging drive mechanism 90, the second lifting drive mechanism 91, the respective brush motors 52 for the first brushing mechanism 82 and the second brushing mechanism 83, the respective relief valves 62 for the first brushing mechanism 82 and the second brushing mechanism 83, etc., are connected as objects to be controlled to the controller 67 of the substrate treatment apparatus 81.

Figure 12:
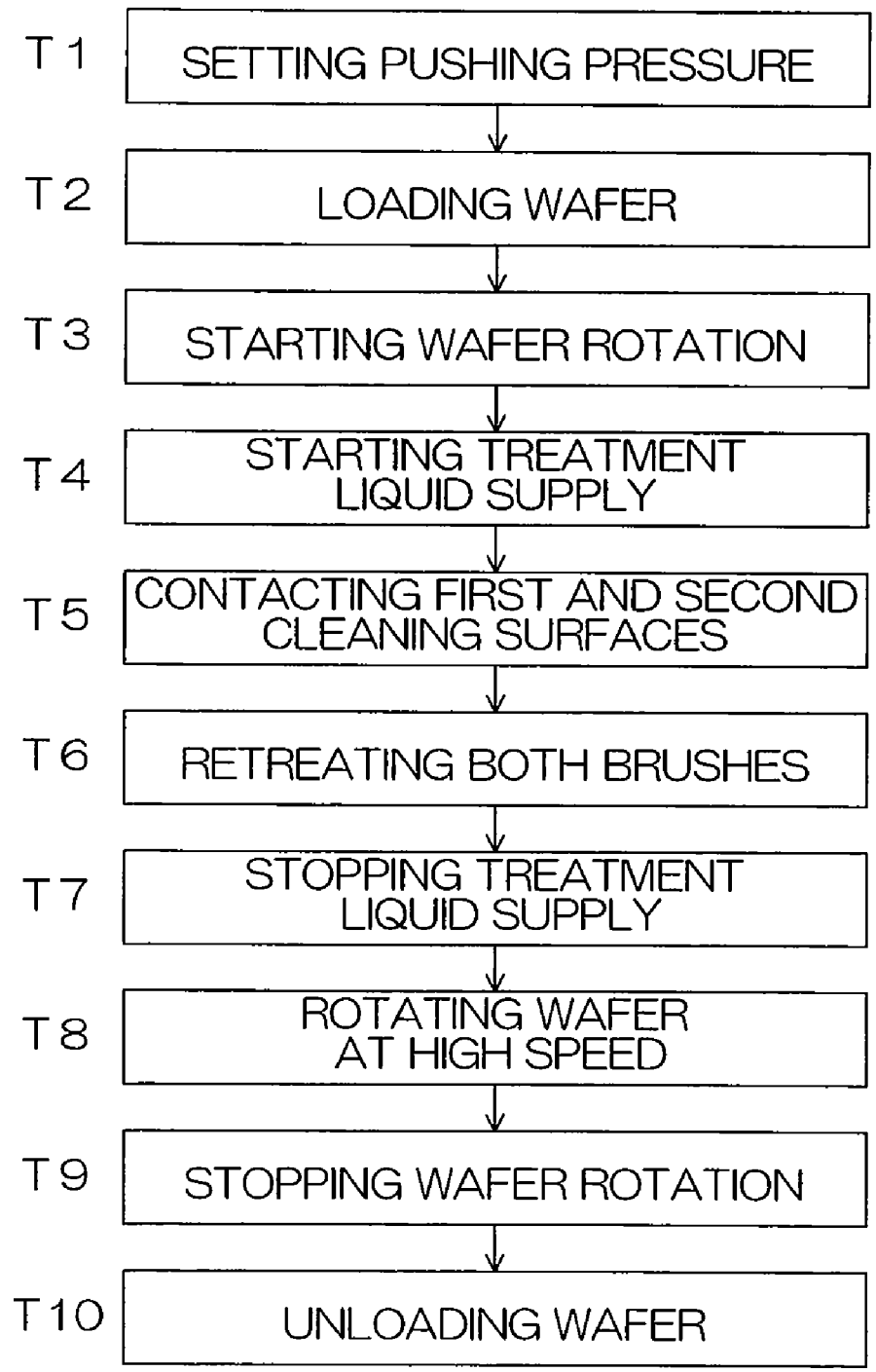
FIG. 12 is a process chart for explaining the treatment in the substrate treatment apparatus shown in FIG. 8.
Figure 13:
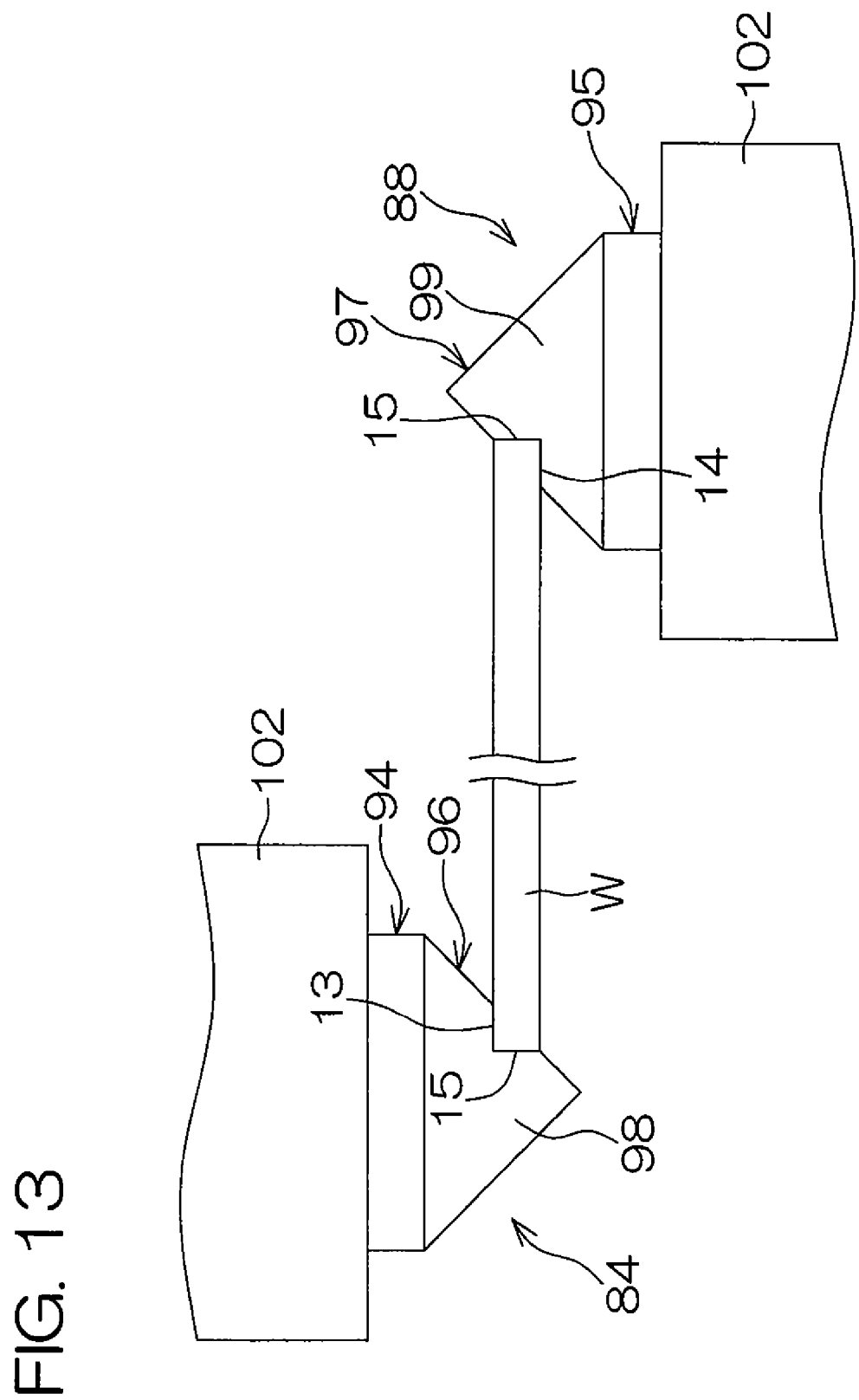
FIG. 13 is a side view showing the states of a first brush and a second brush during the treatment.

FIG. 12 is a process chart for explaining the treatment of the wafer W in the substrate treatment apparatus 81. FIG. 13 is a side view showing the states of the first brush 84 and the second brush 88 during the treatment of the wafer W.

Before the wafer W is treated, the recipe input key 68 is operated by the user, and the pushing pressure of the first brush 84 in the vertical direction to the peripheral area 13 on the front surface of the wafer W and the pushing pressure of the second brush 88 in the vertical direction to the peripheral area 14 on the back surface of the wafer W are input. According to the input from the recipe input key 68, the relief pressures of the respective relief valves 62 of the first brushing mechanism 82 and the second brushing mechanism 83 are set by the controller 67 (step T1: setting pushing pressure).

The wafer W loaded into the treatment chamber 2 is held by the spin chuck 3 (step T2). Then, the spin motor 9 is controlled by the controller 67, and the rotation of the wafer W by the spin chuck 3 is started (step T3). Next, the treatment liquid valve 12 is opened by the controller 67, and the supply of the treatment liquid from the front surface nozzle 4 and the back surface nozzle 5 to the front surface and the back surface of the wafer W, respectively, is started (step T4).

In addition, the respective brush motors 52 of the first brushing mechanism 82 and the second brushing mechanism 83 are controlled by the controller 67, and the first brush 84 and the second brush 88 are rotated in the same direction as that of the wafer W.

Then, the first swinging drive mechanism 86 and the first lifting drive mechanism 87 are controlled by the controller 67, and the cleaning surface 98 of the first brush 84 is made to contact with the peripheral area 13 on the front surface and the peripheral end face 15 of the wafer W. Furthermore, along with this, the second swinging drive mechanism 90 and the second lifting drive mechanism 91 are controlled by the controller 67, and the cleaning surface 99 of the second brush 88 is made to contact with the peripheral area 14 on the back surface and the peripheral end face 15 of the wafer W (step T5). The cleaning surface 98 of the first brush 84 and the cleaning surface 99 of the second brush 88 are made to contact with the wafer W at positions being generally symmetrical with respect to the center of the wafer W.

More specifically, first, the first lifting drive mechanism 87 is controlled, and the first brush 84 is raised or lowered so that the cleaning surface 98 of the first brush 84 is opposed to the peripheral end face 15 of the wafer W. Next, the first swinging drive mechanism 86 is controlled, and the first swinging arm 85 is swung and the first brush 84 is moved horizontally. By virtue of this horizontal movement, the peripheral portion of the wafer W bites into the cleaning surface 98 of the first brush

84, and the cleaning surface 98 of the first brush 84 is pushed to the peripheral area 13 on the front surface and the peripheral end face 15 of the wafer W as shown in FIG. 13. Furthermore, along with the movement of the first brush 84, the second swinging drive mechanism 91 is controlled, and the second brush 88 is raised or lowered so that the cleaning surface 99 of the second brush 88 is opposed to the peripheral end face 15 of the wafer W. Next, the second swinging drive mechanism 90 is controlled, and the second swinging arm 89 is swung and the second brush 88 is moved horizontally. By virtue of this horizontal movement, the peripheral portion of the wafer W bites into the cleaning surface 99 of the second brush 88, and the cleaning surface 99 of the second brush 88 is pushed to the peripheral area 14 on the back surface and the peripheral end face 15 of the wafer W as shown in FIG. 13. Hence, the peripheral area 13 on the front surface and the peripheral area 14 on the back surface and the peripheral end face 15 of the wafer W are cleaned simultaneously.

At this time, by virtue of the operation of the pushing pressure holding mechanism 33 provided in the first swinging arm 85, the first brush 84 is pushed to the peripheral area 13 on the front surface of the wafer W with the pushing pressure set from the recipe input key 68. Hence, the peripheral end face 15 of the wafer W can be cleaned, and at the same time, the peripheral area 13 on the front surface of the wafer W can be cleaned with the cleaning width corresponding to the pushing pressure of the first brush 84. Furthermore, by virtue of the operation of the pushing pressure holding mechanism 33 provided in the second swinging arm 89, the second brush 88 is pushed to the peripheral area 14 on the back surface of the wafer W with the pushing pressure set from the recipe input key 68. Hence, the peripheral end face 15 of the wafer W can be cleaned, and at the same time, the peripheral area 14 on the back surface of the wafer W can be cleaned with the cleaning width corresponding to the pushing pressure of the second brush 88.

Furthermore, while the peripheral portion of the wafer W is cleaned in this manner, contaminants attached to the central area (device forming area) on the front surface of the wafer W can be cleaned away by the treatment liquid supplied to the front surface of the wafer W.

After a predetermined time has passed after the start of cleaning by the first brush 84 and the second brush 88, the first swinging drive mechanism 86, the first lifting drive mechanism 87, the second swinging drive mechanism 90 and the second lifting drive mechanism 91 are controlled by the controller 67. By virtue of the control, the first brush 84 and the second brush 88 are retreated to their home positions at which the brushes are located before the start of the treatment (step T6). In addition, while the first brush 84 and the second brush 88 are returned to their respective home positions, the respective brush motors 52 for the first brush 82 and the second brush 83 are stopped, and the rotations of the first brush 84 and the second brush 88 are stopped. Furthermore, the treatment liquid valve 12 is closed by the controller 67, and the supply of the treatment liquid from the front surface nozzle 4 and the back surface nozzle 5 is stopped (step T7).

Then, the spin motor 9 is controlled by the controller 67, and the wafer W is rotated at a high speed (for example, 3000 rpm) (step T8). Hence, the treatment liquid attached to the wafer W is spun off, and the wafer W can be dried.

After the high-speed rotation of the wafer W is continued for a predetermined time, the spin motor 9 is stopped, and the rotation of the wafer W by the spin chuck 3 is stopped (step T9). Then, after the wafer W becomes stationary, the wafer W having been treated is unloaded from the treatment chamber 2 (step T10).

As described above, the cleaning surface 98 of the first brush 84 is made to contact with the peripheral area 13 on the front surface and the peripheral end face 15 of the wafer W, therefore the peripheral area 13 and the peripheral end face 15 can be cleaned. Furthermore, the cleaning surface 99 of the second brush 88 is made to contact with the peripheral area 14 on the back surface and the peripheral end face 15 of the wafer W, therefore the peripheral area 14 and the peripheral end face 15 can be cleaned.

While the cleaning surface 98 of the first brush 84 is in contact with the peripheral area 13 on the front surface and the peripheral end face 15 of the wafer W, the pushing pressure of the first brush 84 in the vertical direction to the peripheral area 13 on the front surface of the wafer W is held at the preset pushing pressure by virtue of the operation of the pushing pressure holding mechanism 33 provided in the first swinging arm 85. Hence, even if the wafer W is deformed by warping, the peripheral area 13 on the front surface and the peripheral end face 15 of the wafer W can be cleaned satisfactorily, without causing uneven cleaning or nonuniform cleaning width in the peripheral area 13 on the front surface of the wafer W.

In addition, while the cleaning surface 99 of the second brush 88 is in contact with the peripheral area 14 on the back surface and the peripheral end face 15 of the wafer W, the pushing pressure of the second brush 88 in the vertical direction to the peripheral area 14 on the back surface of the wafer W is held at the preset pushing pressure by virtue of the operation of the pushing pressure holding mechanism 33 provided in the second swinging arm 89. Hence, even if the wafer W is deformed by warping, the peripheral area 14 on the back surface and the peripheral end face 15 of the wafer W can be cleaned satisfactorily, without causing uneven cleaning or nonuniform cleaning width in the peripheral area 14 on the back surface of the wafer W.

Furthermore, by changing the pushing pressure of the first brush 84 to the peripheral area 13 on the front surface of the wafer W through the operation of the recipe input key 68, the pushing amount of the first brush 84 in the vertical direction to the peripheral area 13 (the amount of elastic deformation of the cleaning surface 98 in the vertical direction when the cleaning surface 98 of the first brush 84 is made to contact with the wafer W) can be changed. By the change in this pushing amount, the effective contact width between the peripheral area 13 and the cleaning surface 98 of the first brush 84 can be changed. Hence, the cleaning width in the peripheral area 13 on the front surface of the wafer W can be changed easily.

On the other hand, by changing the pushing pressure of the second brush 88 in the vertical direction to the peripheral area 14 on the back surface of the wafer W through the operation of the recipe input key 68, the pushing amount of the second brush 88 to the peripheral area 14 (the amount of elastic deformation of the cleaning surface 99 in the vertical direction when the cleaning surface 99 of the second brush 88 is made to contact with the wafer W) can be changed. By the change in this pushing amount, the effective contact width between the peripheral area 14 and the cleaning surface 99 of the second brush 88 can be changed. Hence, the cleaning width in the peripheral area 14 on the back surface of the wafer W can be changed easily.

In addition, since the cleaning of the peripheral area 13 on the front surface and the peripheral end face 15 of the wafer W by the first brush 84 and the cleaning of the peripheral area 14 on the back surface and the peripheral end face 15 of the wafer W by the second brush 88 are carried out at the same time, the peripheral areas 13 and 14 on both surfaces and the peripheral end face 15 of the wafer W can be cleaned in a short time in comparison with a case in which these processes are carried out at different timings.

The cleaning of the peripheral area 13 on the front surface and the peripheral end face 15 of the wafer W by the first brush 84 and the cleaning of the peripheral area 14 on the back surface and the peripheral end face 15 of the wafer W by the second brush 88 may be carried out at different timings.

In addition, while the first brush 84 and the second brush 88 are in contact with the wafer W, the wafer W is rotated by the spin chuck 3, and the first brush 84, the second brush 88 and the peripheral portion of the wafer W are moved relatively, whereby the peripheral portion of the wafer W can be cleaned efficiently.

Furthermore, while the first brush 84 and the second brush 88 are in contact with the wafer W, the first brush 84 and the second brush 88 are rotated in the same direction as that of the wafer W. Hence, the peripheral portion of the wafer W can be scrubbed. Therefore, the peripheral portion of the wafer W can be cleaned further satisfactorily. The rotation direction of the first brush 84 and the second brush 88 may be opposite to the rotation direction of the wafer W. However, when the rotation direction is the same as that of the wafer W, the wafer W can be rubbed with the first brush 84 and the second brush 88, whereby cleaning with higher quality can be attained.

<Cleaning Effect Checking Test>

Figure 14:
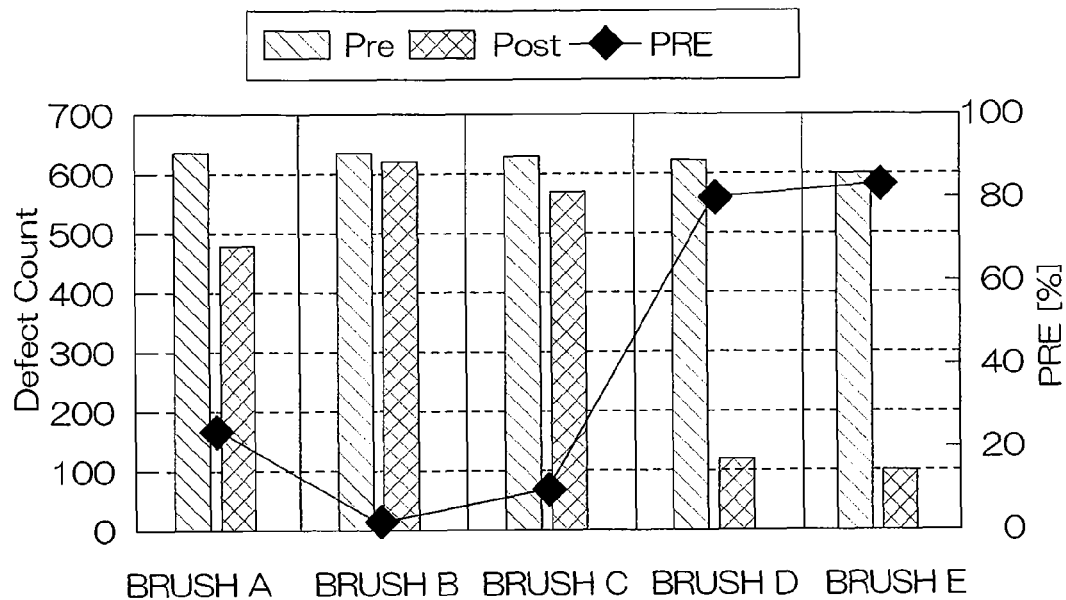
FIG. 14 is a graph showing the results of a test for checking the cleaning effects of brushes of various shapes.

FIG. 14 is a graph showing the results of a test for checking the cleaning effects of brushes of various shapes.

The inventors of the present application made brushes of PVA having five kinds of shapes, that is, brushes A, B, C, D and E. These brushes A to E were selectively mounted on the brush scrubber (trade name: SS-3000) manufactured by Dainippon Screen Mfg. Co., Ltd., and cleaned the peripheral portion of the wafer W using the brushes A to E mounted on the brush scrubber. The number of particles attached to the peripheral area 13 on the front surface, the peripheral area 14 on the back surface and the peripheral end face 15 of the wafer W was counted using the edge tester (trade name: RXW-800) manufactured by Raytex Corporation before and after the cleaning. The results (Pre) of the counting before the cleaning are indicated by hatched bars in the bar graph shown in FIG. 14. The results (Post) of the counting after the cleaning are indicated by cross-hatched bars in the bar graph shown in FIG. 14. Furthermore, the particle removal efficiencies (PRE) calculated from the counting results before and after the cleaning is indicated by the line graph shown in FIG. 14. The particle removal efficiencies (PRE) is derived from the following mathematical expression: (PRE)=(Pre−Post)/Pre×100(%).

The brush A is a columnar brush having a central axis being parallel with the axis orthogonal to the front surface of the wafer W and disposed on the side of the wafer W. When the brush A was used for cleaning, the side surface of the brush A was pushed to the peripheral end face 15 of the wafer W. The particle removal efficiency in this cleaning was approximately 20%.

The brush B is a disc-like brush disposed generally parallel with the front surface of the wafer W and the lower surface thereof is opposed to the peripheral area 13 on the front surface of the wafer W. When the brush B was used for cleaning, the lower surface of the brush B was pushed from above to the peripheral area 13 on the front surface of the wafer W. However, the particles were hardly removed, and the particle removal efficiency in this cleaning was approximately 0%.

The brush C is a cylindrical brush having a groove in the circumferential surface thereof to allow the wafer W to be fitted and disposed on the side of the wafer W (see Document 3). When the brush C was used for cleaning, the peripheral portion of the wafer W was fitted in the groove of the brush C. The particle removal efficiency in this cleaning was approximately 10%.

The brush D includes two brushes respectively having the same shapes as those of the first brush 84 and the second brush 88 according to the second embodiment described above. When the brush D including the two brushes was used for cleaning, the peripheral area 13 on the front surface, the peripheral area 14 on the back surface and the peripheral end face 15 of the wafer W were cleaned as in the case of the second embodiment. The particle removal efficiency in this cleaning was approximately 80%.

The brush E is a brush having the same shape as that of the brush 16 according to the first embodiment described above. When the brush E was used for cleaning, the peripheral area 13 on the front surface, the peripheral area 14 on the back surface and the peripheral end face 15 of the wafer W were cleaned as in the case of the first embodiment. The particle removal efficiency in this cleaning exceeded 80%.

According to the results, it is understood that the brush E corresponding to the brush 16 according to the first embodiment and the brush D corresponding to the first brush 84 and the second brush 88 according to the second embodiment are high in the performance of cleaning the peripheral area 13 on the front surface, the peripheral area 14 on the back surface and the peripheral end face 15 of the wafer W in comparison with the brushes A to C according to the conventional proposals.

Figure 15:
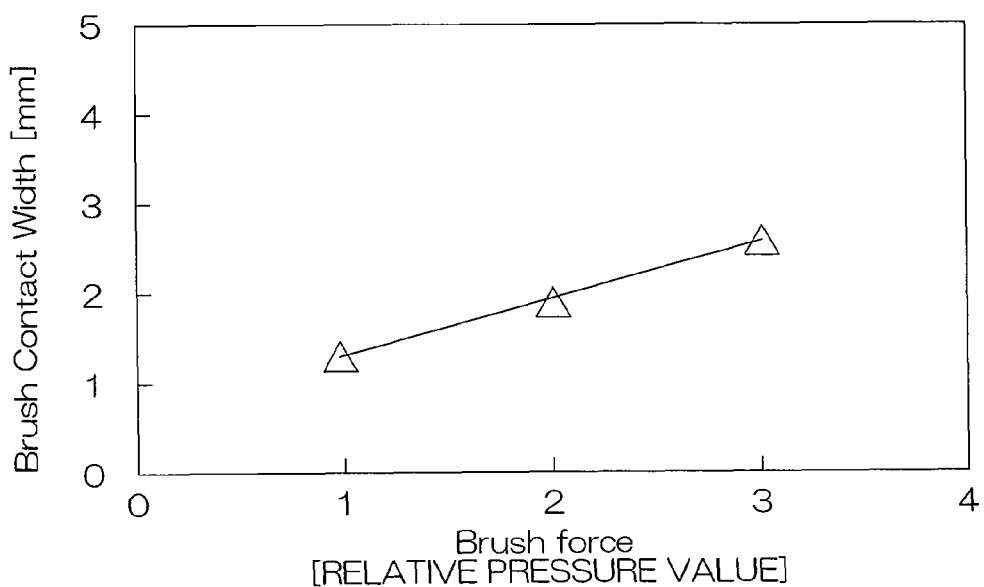
FIG. 15 is a graph showing the relationship between the pushing pressure of the brush and the contact width (cleaning width) of the brush in the peripheral area on the front surface of a wafer.

FIG. 15 is a graph showing the relationship between the pushing pressure of the brush 16 and the first brush 84 and the contact width of the brush 16 in the peripheral area 13 on the front surface of the wafer W.

The brush 16 was soaked in photoresist and pushed to the peripheral portion of the wafer W at a predetermined pushing pressure. Then, the width of the photoresist attached to the peripheral area 13 on the front surface of the wafer W was measured. In addition, the brush 84 was soaked in the photoresist and pushed to the peripheral portion of the wafer W at the predetermined pushing pressure. Then, the width of the photoresist attached to the peripheral area 13 on the front surface of the wafer W was measured. Since the inclination angle of the cleaning surface 28 of the brush 16 and the inclination angle of the cleaning surface 98 of the first brush 84 are both 45 degrees, the results of the tests conducted for the two brushes are the same and represented by the line graph shown in FIG. 15.

In other words, when the pushing pressure of the brush 16 and the first brush 84 was 1 [a relative pressure value], the contact width of the brush 16 and the first brush 84 in the peripheral area 13 on the front surface of the wafer W was approximately 2 mm. When the pushing pressure of the brush 16 and the first brush 84 was 2 [a relative pressure value], the contact width of the brush 16 and the first brush 84 in the peripheral area 13 on the front surface of the wafer W was approximately 1.8 mm. Furthermore, when the pushing pressure of the brush 16 and the first brush 84 was 3 [a relative pressure value], the contact width of the brush 16 and the first brush 84 in the peripheral area 13 on the front surface of the wafer W was approximately 2.4 mm. The relative pressure value is herein defined as a relative pressure value obtained when it is assumed that the predetermined pressure value of the pushing pressure is 1.

According to the results, it is understood that the pushing pressure of the brush 16 and the first brush 84 and the contact width of the brush 16 and the first brush 84 have a generally directly proportional relationship. Hence, it is also understood that the cleaning width in the peripheral area 13 on the front surface of the wafer W can be controlled satisfactorily by the pushing pressure of the brush 16 and the first brush 84. Furthermore, according to the results, it is expected that the cleaning width in the peripheral area 14 on the back surface of the wafer W would be able to be controlled satisfactorily by the pushing pressure of the second brush 88 as in the first brush 84.

Although the two embodiments according to the present invention have been described above, the present invention can also be implemented in other embodiments. For example, while the brush 16, the first brush 84 and the second brush 88 are in contact with the wafer W, the first brush 84 and the second brush 88 may not be rotated but be made stationary.

In addition, a configuration in which the brush 16, the first brush 84 and the second brush 88 are moved relatively with the peripheral portion of the wafer W by the rotation of the wafer W is taken as an example. However, when a rectangular substrate is treated, it may be possible to employ a configuration in which the substrate is made stationary and the brush is moved along the peripheral portion of the substrate. It may also be possible to relatively move the brush along the peripheral portion of the substrate by moving both the substrate and the brush, as a matter of course.

Furthermore, these embodiments are only specific examples for clarifying the technical concepts of the present invention, and the present invention should therefore not be construed as being limited to only these specific examples. The spirit and scope of the present invention is limited only by the appended claims.

This application corresponds to Japanese Patent Application No. 2006-95552, Japanese Patent Application No. 2006-95553 and Japanese Patent Application No. 2006-95554, filed to Japan Patent Office on Mar. 30, 2006. Disclosure of these applications shall be incorporated herein by reference.

What is claimed is:

1. A substrate treatment apparatus comprising:
    a substrate holding mechanism for holding a substrate;
    a first brush made of an elastically deformable material and having a cleaning surface inclined with respect to a perpendicular direction perpendicular to one surface of the substrate held by the substrate holding mechanism;
    a first brush moving mechanism for moving the first brush with respect to the substrate held by the substrate holding mechanism;
    a controller for controlling the first brush moving mechanism so that the cleaning surface is made to contact with a peripheral area on the one surface and a peripheral end face of the substrate held by the substrate holding mechanism;
    a first brush relative movement mechanism for relatively moving the first brush and the substrate held by the substrate holding mechanism so that the first brush is moved in a circumferential direction of the substrate; and
    a first pushing pressure holding mechanism for holding a pushing pressure of the first brush in the direction perpendicular to the peripheral area on the one surface of the substrate at a preset pushing pressure, the first pushing pressure holding mechanism being arranged to hold the pushing pressure at the preset pushing pressure during the relative movement of the substrate and the first brush regardless of a warp deformation of the substrate, wherein the first pushing pressure holding mechanism includes an air cylinder, an air supply pipe connected to the air cylinder, and a relief valve arranged in the air supply pipe.

2. The substrate treatment apparatus according to claim 1, wherein
    the first brush has a shape rotationally symmetrical around a central axis extending in the perpendicular direction, and
    the substrate treatment apparatus comprises a first brush rotation mechanism for rotating the first brush around the central axis.

3. The substrate treatment apparatus according to claim 1, wherein
    the cleaning surface includes a first cleaning surface formed in a shape narrowed toward one side in the perpendicular direction and a second cleaning surface formed in a shape expanding toward the one side in the perpendicular direction from an end edge of the first cleaning surface on the one side, and
    the controller controls the first brush moving mechanism so that the first cleaning surface is made to contact with the peripheral area on the one surface and the peripheral end face of the substrate held by the substrate holding mechanism and the second cleaning surface is made to contact with the peripheral area on the other surface on the opposite side of the one surface and the peripheral end face of the substrate held by the substrate holding mechanism.

4. The substrate treatment apparatus according to claim 1, wherein
    the first brush is formed in a shape tapered toward one side in the perpendicular direction,
    the substrate treatment apparatus further comprises:
    a second brush made of an elastically deformable material, formed in a shape tapered toward the opposite side of the one side in the perpendicular direction and having a cleaning surface inclined with respect to the perpendicular direction; and
    a second brush moving mechanism for moving the second brush with respect to the substrate held by the substrate holding mechanism, and
    the controller further controls the second brush moving mechanism so that the cleaning surface of the second brush is made to contact with a peripheral area on the other surface on the opposite side of the one surface and the peripheral end face of the substrate held by the substrate holding mechanism.

5. The substrate treatment apparatus according to claim 4, further comprising:
    a second pushing pressure holding mechanism for holding a pushing pressure of the second brush in the perpendicular direction to the peripheral area on the other surface of the substrate at a preset pushing pressure.

6. The substrate treatment apparatus according to claim 4, wherein
    the second brush has a shape rotationally symmetrical around a central axis extending in the perpendicular direction, and
    the substrate treatment apparatus comprises a second brush rotation mechanism for rotating the second brush around a central axis.

7. The substrate treatment apparatus according to claim 4, further comprising:
    a second brush relative movement mechanism for relatively moving the substrate held by the substrate holding mechanism and the second brush so that the second brush is moved in a circumferential direction of the substrate.

8. The substrate treatment apparatus according to claim 1, further comprising:
a treatment liquid supply mechanism for supplying treatment liquid to an area located more inward than the peripheral area on at least the one surface of the substrate held by the substrate holding mechanism.

9. A substrate treatment apparatus comprising:
a substrate holding mechanism for holding a substrate;
a brush made of an elastically deformable material, and having a first cleaning surface formed in a shape narrowed toward one side in a perpendicular direction perpendicular to one surface of the substrate held by the substrate holding mechanism and a second cleaning surface formed in a shape expanding toward the one side in the perpendicular direction from an end edge of the first cleaning surface on the one side;
a brush moving mechanism for moving the brush with respect to the substrate held by the substrate holding mechanism, and
a controller for controlling the brush moving mechanism so that the first cleaning surface is made to contact with a peripheral area on the one surface and a peripheral end face of the substrate held by the substrate holding mechanism, and the second cleaning surface is made to contact with a peripheral area on the other surface on the opposite side of the one surface and the peripheral end face of the substrate held by the substrate holding mechanism, the controller being arranged to control the brush moving mechanism such that only one of the first and second cleaning surfaces is brought into contact with the substrate, and thereafter only the other of the first and second cleaning surfaces is brought into contact with the substrate.

10. The substrate treatment apparatus according to claim 9, wherein
the brush has a shape rotationally symmetrical around a central axis extending in the perpendicular direction, and
the substrate treatment apparatus further comprises a brush rotation mechanism for rotating the brush around the central axis.

11. The substrate treatment apparatus according to claim 9, further comprising:
a relative movement mechanism for relatively moving the substrate held by the substrate holding mechanism and the brush so that the brush is moved in a circumferential direction of the substrate.

12. The substrate treatment apparatus according to claim 9, further comprising:
a treatment liquid supply mechanism for supplying a treatment liquid to an area located more inward than the peripheral area on at least the one surface of the substrate held by the substrate holding mechanism.

13. The substrate treatment apparatus according to claim 3, wherein the controller is arranged to control the brush moving mechanism such that only one of the first and second cleaning surfaces is brought into contact with the substrate, and thereafter only the other of the first and second cleaning surfaces is brought into contact with the substrate.

14. The substrate treatment apparatus according to claim 1, wherein
the first brush relative movement mechanism includes a rotation mechanism arranged to rotate the substrate held by the substrate holding mechanism about an axis extending through a center of a major surface of the substrate, and
the first pushing pressure holding mechanism is arranged to hold the pushing pressure at the preset pushing pressure irrespective of a position change of the first brush on the peripheral area on the one surface of the substrate due to the rotation of the substrate by the rotation mechanism.

15. The substrate treatment apparatus according to claim 11, wherein the first brush relative movement mechanism includes a rotation mechanism arranged to rotate the substrate held by the substrate holding mechanism about an axis extending through a center of a major surface of the substrate.

16. A substrate treatment apparatus comprising:
a substrate holding mechanism for holding a substrate;
a brush made of an elastically deformable material, and having a first cleaning surface formed in a truncated conical shape narrowed toward one side in a perpendicular direction perpendicular to one surface of the substrate held by the substrate holding mechanism, and a second cleaning surface formed in a truncated conical shape expanding toward the one side in the perpendicular direction from a narrow end edge of the first cleaning surface on the one side, a narrow end edge of the second cleaning surface being directly connected to the narrow end edge of the first cleaning surface;
a brush moving mechanism for moving the brush with respect to the substrate held by the substrate holding mechanism, and
a controller configured for controlling the brush moving mechanism so that the first cleaning surface is made to contact with a peripheral area on the one surface and a peripheral end face of the substrate held by the substrate holding mechanism, and the second cleaning surface is made to contact with a peripheral area on the other surface on the opposite side of the one surface and the peripheral end face of the substrate held by the substrate holding mechanism, wherein the controller is arranged to control the brush moving mechanism such that only one of the first and second cleaning surfaces is brought into contact with the substrate, and thereafter only the other of the first and second cleaning surfaces is brought into contact with the substrate.

17. The substrate treatment apparatus according to claim 16, wherein
the brush has a shape rotationally symmetrical around a central axis extending in the perpendicular direction, and
the substrate treatment apparatus further comprises a brush rotation mechanism for rotating the brush around the central axis.

18. The substrate treatment apparatus according to claim 16, further comprising:
a relative movement mechanism for relatively moving the substrate held by the substrate holding mechanism and the brush so that the brush is moved in a circumferential direction of the substrate.

19. The substrate treatment apparatus according to claim 18, wherein the brush relative movement mechanism includes a rotation mechanism arranged to rotate the substrate held by the substrate holding mechanism about an axis extending through a center of a major surface of the substrate.

20. The substrate treatment apparatus according to claim 16, further comprising:
a treatment liquid supply mechanism for supplying a treatment liquid to an area located more inward than the peripheral area on at least the one surface of the substrate held by the substrate holding mechanism.

21. A substrate treatment apparatus comprising:

a substrate holding mechanism for holding a substrate;

a first brush made of an elastically deformable material and having a cleaning surface inclined with respect to a perpendicular direction perpendicular to one surface of the substrate held by the substrate holding mechanism;

a first brush moving mechanism for moving the first brush with respect to the substrate held by the substrate holding mechanism;

a controller for controlling the first brush moving mechanism so that the cleaning surface is made to contact with a peripheral area on the one surface and a peripheral end face of the substrate held by the substrate holding mechanism;

a first brush relative movement mechanism for relatively moving the first brush and the substrate held by the substrate holding mechanism so that the first brush is moved in a circumferential direction of the substrate; and a first pushing pressure holding mechanism for holding a pushing pressure of the first brush in the direction perpendicular to the peripheral area on the one surface of the substrate at a preset pushing pressure, the first pushing pressure holding mechanism being arranged to hold the pushing pressure at the preset pushing pressure during the relative movement of the substrate and the first brush regardless of a warp deformation of the substrate, wherein the cleaning surface includes a first cleaning surface formed in a shape narrowed toward one side in the perpendicular direction and a second cleaning surface formed in a shape expanding toward the one side in the perpendicular direction from an end edge of the first cleaning surface on the one side, the controller controls the first brush moving mechanism so that the first cleaning surface is made to contact with the peripheral area on the one surface and the peripheral end face of the substrate held by the substrate holding mechanism and the second cleaning surface is made to contact with the peripheral area on the other surface on the opposite side of the one surface and the peripheral end face of the substrate held by the substrate holding mechanism, and the controller is arranged to control the brush moving mechanism such that only one of the first and second cleaning surfaces is brought into contact with the substrate, and thereafter only the other of the first and second cleaning surfaces is brought into contact with the substrate.

* * * * *